US012396217B2

(12) United States Patent
Dorow et al.

(10) Patent No.: US 12,396,217 B2
(45) Date of Patent: Aug. 19, 2025

(54) ENCAPSULATION FOR TRANSITION METAL DICHALCOGENIDE NANOSHEET TRANSISTOR AND METHODS OF FABRICATION

(71) Applicant: Intel Corporation, Santa Clara, CA (US)

(72) Inventors: Chelsey Dorow, Portland, OR (US); Kevin O'Brien, Portland, OR (US); Carl Naylor, Portland, OR (US); Uygar Avci, Portland, OR (US); Sudarat Lee, Hillsboro, OR (US); Ashish Verma Penumatcha, Beaverton, OR (US); Chia-Ching Lin, Portland, OR (US); Tanay Gosavi, Portland, OR (US); Shriram Shivaraman, Hillsboro, OR (US); Kirby Maxey, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 966 days.

(21) Appl. No.: 17/133,056

(22) Filed: Dec. 23, 2020

(65) Prior Publication Data

US 2022/0199838 A1 Jun. 23, 2022

(51) Int. Cl.
*H10D 30/67* (2025.01)
*H01L 23/29* (2006.01)
(Continued)

(52) U.S. Cl.
CPC ....... *H10D 30/6757* (2025.01); *H01L 23/291* (2013.01); *H10D 30/675* (2025.01);
(Continued)

(58) Field of Classification Search
CPC ... H01L 29/78681; H01L 29/24; H01L 29/18; H01L 29/66969; H01L 29/517;
(Continued)

(56) References Cited

U.S. PATENT DOCUMENTS

2018/0151751 A1\* 5/2018 Yeh ...................... H01L 29/1606
2021/0193801 A1\* 6/2021 Wang .................... H10D 64/01
(Continued)

OTHER PUBLICATIONS

Doped WS2 transistors with large on-off ratio and high on-current; Kumar et al.; Jul. 8, 2020; 2020 Device Research Conference (DRC); IEEE Explore; DOI:10.1109/DRC50226.2020.9135155; URL:https:/ieeexplore.ieee.org/document/9135155 (Year: 2020).\*
(Continued)

*Primary Examiner* — Christine S. Kim
*Assistant Examiner* — Tyler J Wiegand
(74) *Attorney, Agent, or Firm* — Essential Patents Group, LLP

(57) ABSTRACT

A transistor includes a channel layer including a transition metal dichalcogenide (TMD) material, an encapsulation layer on a first portion of the channel layer, a gate electrode above the encapsulation layer, a gate dielectric layer between the gate electrode and the encapsulation layer. The transistor further includes a source contact on a second portion of the channel layer and a drain contact on a third portion of the channel layer, where the gate structure is between drain contact and the source contact.

13 Claims, 17 Drawing Sheets

| (51) | Int. Cl. | |
|---|---|---|
| | H10D 62/10 | (2025.01) |
| | H10D 62/80 | (2025.01) |
| | H10D 64/68 | (2025.01) |
| | H10D 84/01 | (2025.01) |
| | H10D 84/03 | (2025.01) |

(52) U.S. Cl.
CPC .......... H10D 62/118 (2025.01); H10D 62/80 (2025.01); H10D 64/691 (2025.01); H10D 84/0172 (2025.01); H10D 84/038 (2025.01)

(58) Field of Classification Search
CPC ........... H01L 29/78969; H01L 29/0665; H01L 2924/10831; H01L 21/02568; H01L 23/517
See application file for complete search history.

(56) References Cited

U.S. PATENT DOCUMENTS

| 2021/0264959 | A1* | 8/2021 | Rabkin | .................... H01L 29/16 |
| 2021/0376133 | A1* | 12/2021 | Hung | ....................... H01L 29/24 |
| 2021/0408296 | A1* | 12/2021 | Zhong | ............... H01L 29/66742 |

OTHER PUBLICATIONS

Electronic properties of MoS2/MoOX interfaces: Implications in Tunnel Field Effect Transistors and Hole Contacts; Santosh et al.; Sep. 26, 2016; Scientific Reports; 6, Article No. 33562 (2016) ; URL: https://www.nature.com/articles/srep33562 (Year: 2016).*

Partial European Search Report from European Patent Application No. 21210305.5 notified May 2, 2022, 16 pgs.

Illarionov, Yu Yu, et al., "Annealing and Encapsulation of CVD-MoS2 FETs with 10 On/Off Current Ratio", 2018 76th Device Research Conference, Jun. 24, 2018, 2 pgs.

Young, Chadwin D., et al., "Electrical Characterization of Process Induced Effects of Non-Silicon Devices", 2018 International Conference on IC Design & Technology (ICICDT), Jun. 4, 2018, pp. 173-176.

Extended European Search Report from European Patent Application No. 21210305.5 notified Aug. 2, 2022, 14 pgs.

* cited by examiner

300

Pattern a material layer stack including a plurality of 2-dimensional channel material into a block having sidewalls
310

Form a dielectric on the block
320

Form anchors and etch dielectric from a portion of the block and form suspended channel layers
330

Form a liner on the channel layers
340

Form a gate on the liner
350

Form a source contact and a drain contact on opposite sides of the gate
360

FIG. 3

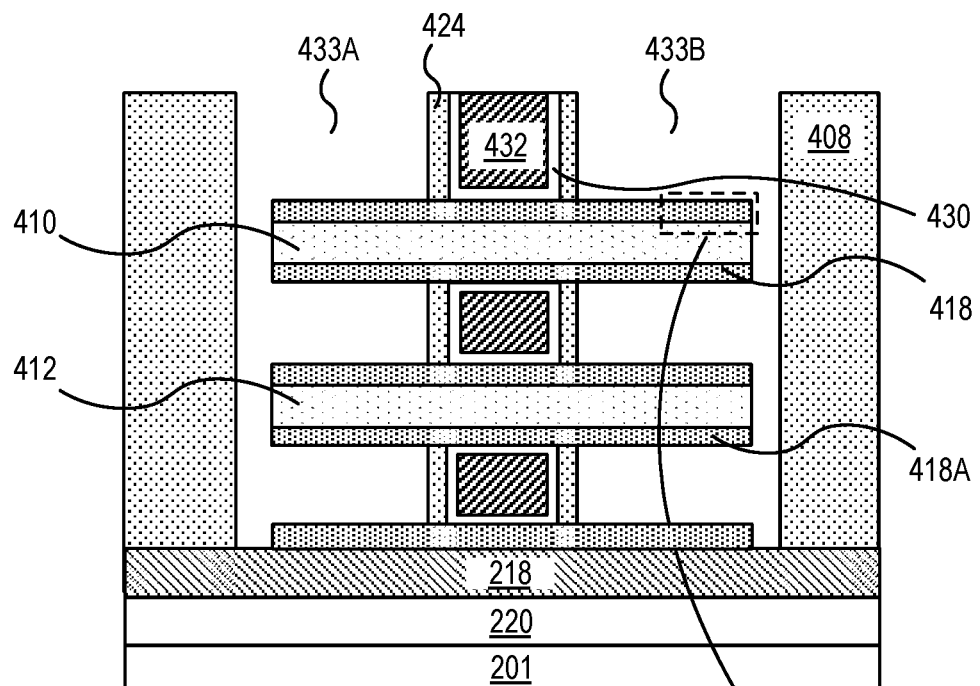
FIG. 11A
FIG. 11B
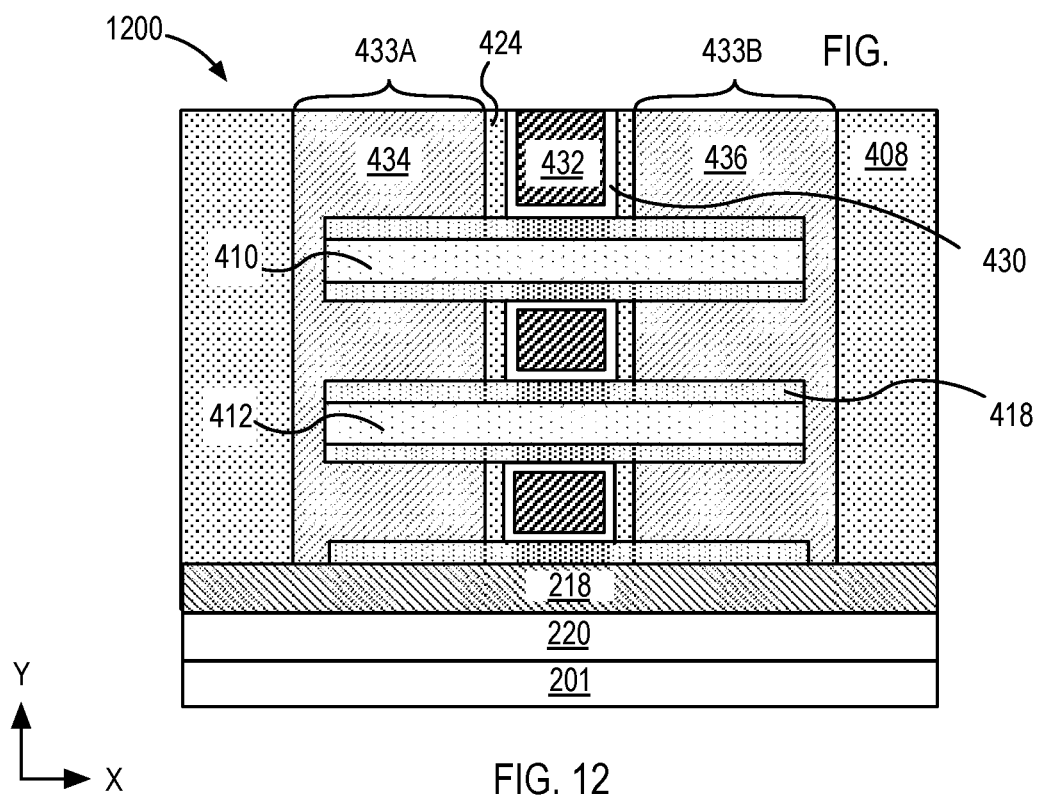
FIG. 12

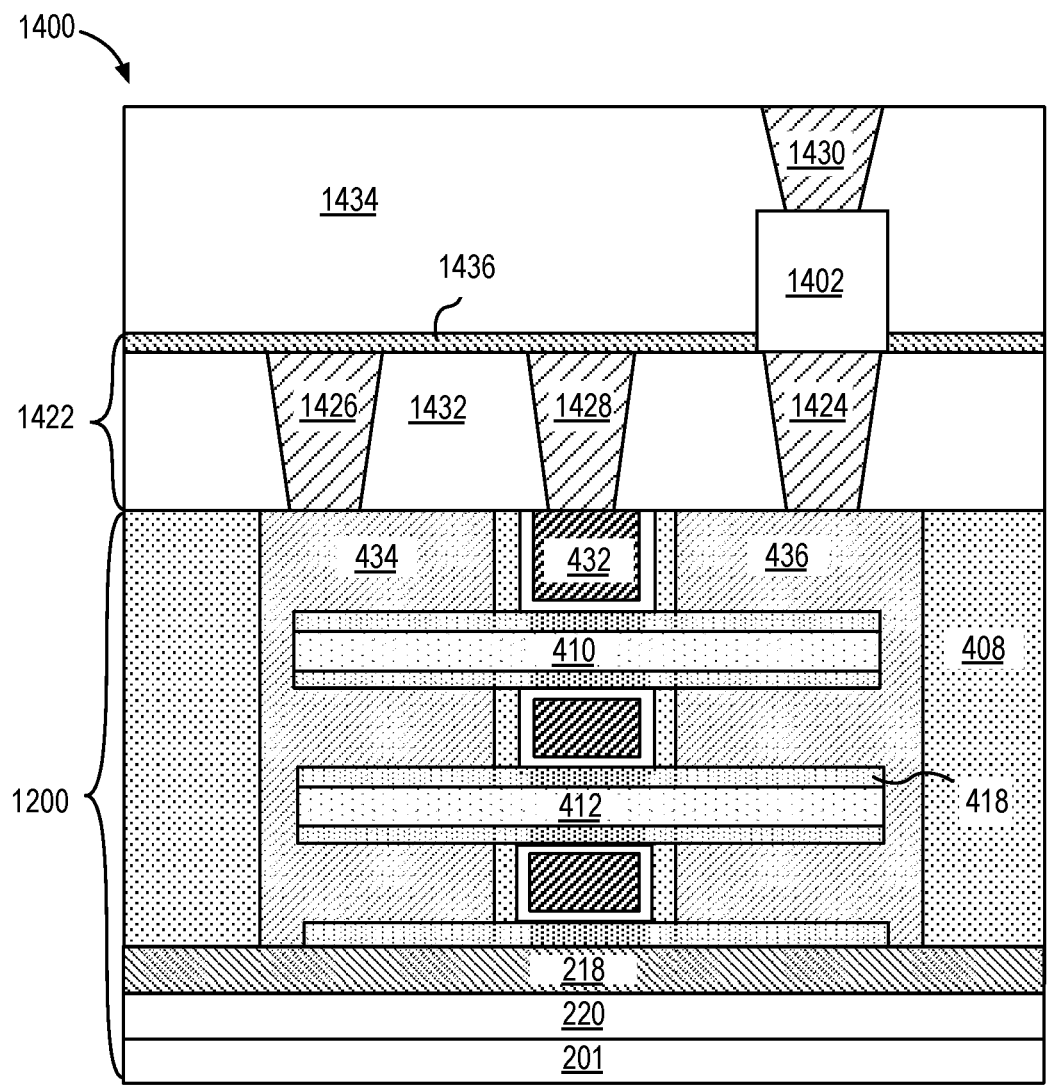
FIG. 14A
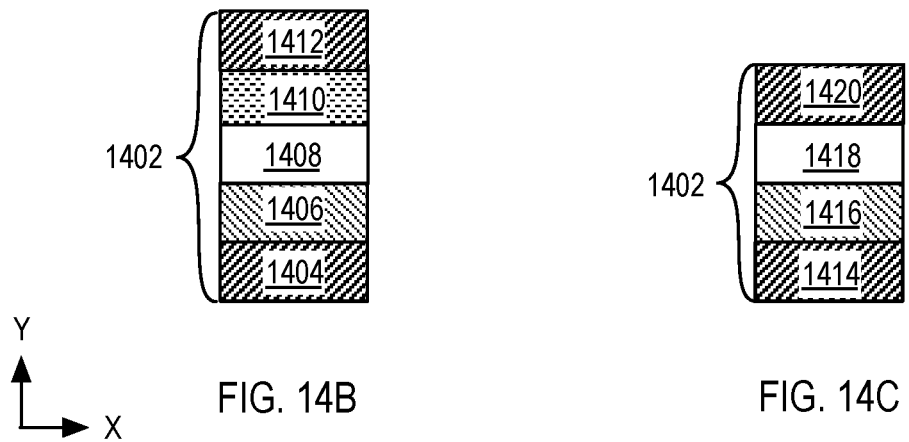
FIG. 14B
FIG. 14C

ENCAPSULATION FOR TRANSITION METAL DICHALCOGENIDE NANOSHEET TRANSISTOR AND METHODS OF FABRICATION

BACKGROUND

Scaling of features in integrated circuit structures has been a driving force behind an ever-growing semiconductor industry. Scaling to smaller and smaller transistors enables increased densities of functional units on limited real estate of semiconductor chips. Scaling of such transistors, which include silicon channels, becomes more challenging when device metrics such as mobility, subthreshold slope or gate capacitance, for example, become adversely affected at dimensions less than 5 nm. Non-silicon based channel materials that include transition metal dichalcogenide (TMD) have emerged as viable alternatives for implementation as transistor channels. However, fabrication of N-type TMD transistor and P-type TMD transistor on a same substrate continues to be challenging.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 3 is a method to fabricate a transistor depicted in FIG. 2A, in accordance with an embodiment of the present disclosure.

FIG. 11A is a cross-sectional illustration of the structure in FIG. 10A following the formation of an opening for depositing source contact material on one end of a plurality of TMD channel layers and an opening for depositing a drain contact material on a second end of the plurality of TMD channel layers, in accordance with an embodiment of the present disclosure.

FIG. 11B is an enhanced cross-sectional illustration of a top portion of a TMD channel layer.

FIG. 12 is a cross-sectional illustration of the structure in FIG. 11A following the formation of a source contact on one end of a plurality of TMD channel layers and a drain contact on a second end of the plurality of TMD channel layers, in accordance with an embodiment of the present disclosure.

FIG. 14A is a cross-sectional illustration of a memory device coupled with a transistor including a plurality of TMD channels, in accordance with an embodiment of the present disclosure.

FIG. 14B is a cross-sectional illustration of a magnetic tunnel junction device, in accordance with an embodiment of the present disclosure.

FIG. 14C is a cross-sectional illustration of a resistive random-access memory device, in accordance with an embodiment of the present disclosure.

DESCRIPTION OF THE EMBODIMENTS

Figure 1A:
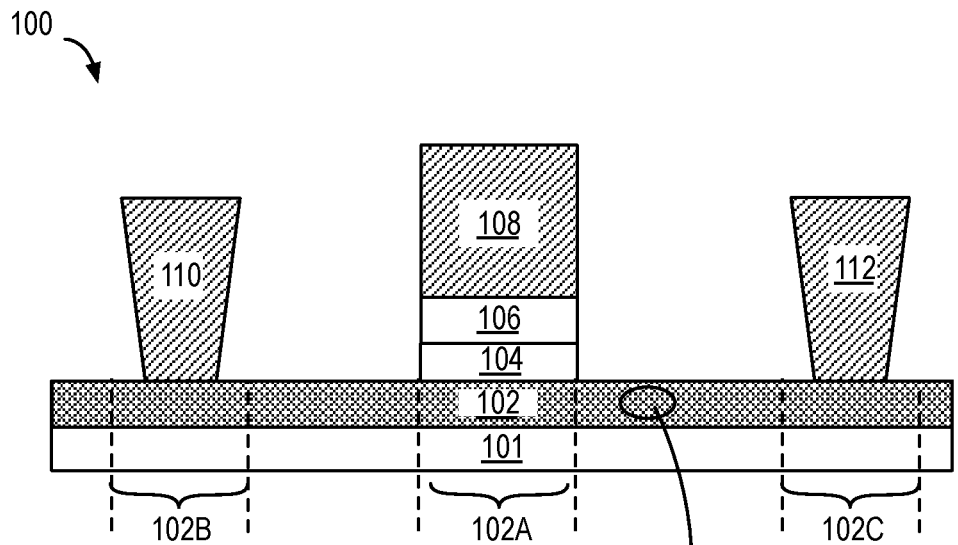
FIG. 1A is a cross-sectional illustration of a transistor including an encapsulation layer, in accordance with an embodiment of the present disclosure.

Encapsulation for TMD nanosheet transistors and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with TMD nanosheet transistor, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

To enable feature size scaling in silicon channels, transistor architecture including nanowire and stacked nanowires have been adopted. Nanowire transistors provide benefits such as near ideal sub-threshold slopes, low leakage current and less degradation of mobility with gate voltage compared to other transistor architectures. Stacked nanowires can advantageously increase drive current in a transistors. As dimensions of various components of nanowire transistors (channel width and gate length) are decreased to increase device density, device metrics such as carrier mobility and subthreshold slope, parasitic capacitance, may be adversely impacted. Nanowire transistors that include monocrystalline silicon channels, in particular, are prone to mobility and subthreshold slope degradation as channel widths approach 7 nm. Mobility in silicon nanowires diminishes by over 60% as nanowires are scaled below 7 nm to 3.5 nm, for example. Mobility degradation may be attributed to impurity scattering loss in silicon channels.

Transistors fashioned from two dimensional materials, such as transition metal dichalcogenide (TMD), offer several advantages over conventional silicon. In such implementation, TMD nanosheets can be implemented as a channel layer. A monolayer of a TMD material may be on the order of 0.7 nm, or inherently 2-dimensional (2D). TMD materials have a high Young's modulus and can be utilized to form 2-d nanosheets. In some embodiments, the plurality of nanosheets may be stacked to provide channel layers for a TMD nanosheet transistor.

While nanosheet transistors fashioned from TMD materials offer transistor performance benefits, doping of TMD channel layers to fabricate an N-type or P-type FET is challenging. Transistors fabricated from most semiconducting TMD materials heavily favor N-type over P-type behavior. The N-type behavior arises from chalcogen vacancies in TMD materials. Examples of TMD materials that exhibit N-type behavior include sulfides of Mo, W, Cr or Ti. Examples of TMD materials that exhibit P-type includes, for example, $WSe_2$ or $WSe_2$ doped with Ta. Typically, P-type behavior in transistors utilizing TMD materials are obtained by work function engineering of the gate or the source-drain contact region.

In stacked nanosheet architecture, layers of TMD material are formed part of a material layer stack, where individual layers of TMD material are sandwiched between sacrificial materials. The sacrificial materials are removed to release layers of TMD material for fabrication of transistors. Fabrication of an N-type or a P-type transistor can be chosen based on a type of TMD material. However, integrating different TMD materials on a single plane for a complimentary N and P type transistor is challenging.

The inventors have found that by encapsulating the TMD channel material with a liner (an encapsulation layer) that can modulate threshold voltage, $V_T$, of a transistor, a single TMD channel material can be advantageously utilized to co-fabricate an N-type adjacent to a P-type FET device. The encapsulation layer is designed to attract electrons from or donate electrons to the TMD channel material. Attracting electrons from the TMD channel material may introduce shallow acceptor states close to the valence band edge of the TMD channel material creating a p-type doping effect. Donating electrons to TMD channel material from encapsulation layer may introduce shallow donor states close to a conduction band edge, leading to a p-type doping effect. In embodiments, electron donor and acceptor levels may be controlled by changing the level of defects in the encapsulation layer. The defects in the encapsulation layer act as centers for charge carrier and depending on the material can provide both positive and negative charge carriers.

In embodiments, because the encapsulation layer can be deposited or grown after forming suspended TMD channel layers, N and P type FETs can be co-fabricated. In one example, an N and a P device may be co-fabricated until a process operation to release the stacked nanosheets after which point, an N or a P region may be masked for further fabrication of P or an N type transistor. This may be followed by masking of the P or the N region to fabricate the N or the P type transistor.

In exemplary embodiments, the encapsulation layer includes a material that has interstitials. The number of defects can be controlled during deposition. Interstitials can result in charge centers in the encapsulation layer and each interstitial site can advantageously donate charge carriers to the TMD channel material. The interstitials may exist in various charged states depending on a material of the charge transfer layer. The charge carriers can be of both negative and positive polarity and may facilitate fabrication of both N-FET and a P-FET devices depending on a material of the encapsulation layer.

In accordance with an embodiment of the present disclosure a transistor includes a channel including a transition metal dichalcogenide (TMD) material, an encapsulation layer on a first portion of the channel, a gate electrode above the encapsulation layer and a gate dielectric layer between the gate electrode and the encapsulation layer. The transistor may be an N-type or a P-type depending on a choice of TMD channel material as well as on the material of the encapsulation layer. The transistor further includes a source contact on a second portion of the channel layer and a drain contact on a third portion of the channel layer, where the gate electrode is between drain contact and the source contact.

Because the choice of TMD channel material and encapsulation can influence a transistor to be a P or an N-type, integration of N and P-type transistor can be advantageously facilitated on a same plane of a substrate using a single channel material. In exemplary embodiments, the N-type and P-type transistors are laterally spaced apart by a dielectric. In one embodiment, for a given TMD channel material, an N-type transistor may include an encapsulation layer, while the same encapsulation layer may be absent in a P-type counterpart or vice versa. In a second embodiment, for a given TMD channel material, an N-type transistor may include a first encapsulation layer and the P-type transistor may include a second encapsulation layer. In embodiments, the TMD channel material and the encapsulation layer may be integrated into a planar transistor or a stacked nanosheet transistor architecture.

FIG. 1A is a cross-sectional illustration of a transistor 100. The transistor 100 may have a planar or non-planar geometry. In the illustrative embodiment, the transistor 100 has a planar geometry. In an embodiment, the transistor 100 includes a channel layer 102 including a transition metal dichalcogenide (TMD) material (herein TMD channel layer 102), an encapsulation layer 104 on a portion 102A of the TMD channel layer 102. The encapsulation layer 104 includes a material that can facilitate charge transfer between the TMD channel layer 102 and the encapsulation layer 104 to influence an FET characteristic of the transistor 100, for example N-FET or P-FET. As such, the transistor 100 further includes an insulator such as a gate dielectric layer 106 between the encapsulation layer 104 and a gate electrode 108. The transistor further includes a source contact 110 on a portion 102B of the TMD channel layer 102 and a drain contact 112 on a portion 102C of the TMD channel layer 102.

Figure 1B:
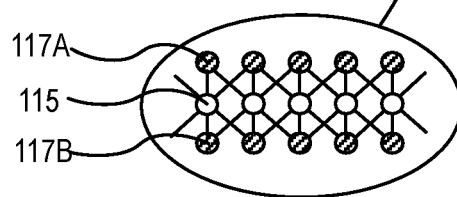
FIG. 1B is a schematic of a monolayer of TMD material.

FIG. 1B is a schematic of a monolayer of TMD material. In the illustrative embodiment, the TMD material includes a layer of a transition metal 115 between a layer of chalcogen atoms 117A and a layer of chalcogen atoms 117B, as shown. Depending on arrangements of the atoms, the TMDs can have various crystal orientations, such as trigonal prismatic (hexagonal), octahedral (tetragonal, T) or their distorted phase (TO). In the illustrative embodiment, the TMD material is hexagonal. The monolayer of TMD (TMD nanosheet), as shown has a thickness of approximately 0.7 nm. The transition metal 115 includes molybdenum, tungsten, titanium or chromium, and the chalcogen atom 117A and 117B include one of sulfur, selenium or tellurium. TMD materials described above advantageously provide channel mobility as high as 700 cm$^2$ V$^{-1}$ s$^{-1}$.

Referring again to FIG. 1A, the encapsulation layer 104 is a layer that can transfer charge to and from the TMD channel layer 102. The encapsulation layer 104 is designed to attract electrons from or donate electrons to the TMD channel layer 102. Polarity of charge and the magnitude of the charges depends on the material of the encapsulation layer 104. Attracting electrons from the encapsulation layer 104 may introduce shallow acceptor states close to the valence band edge of the TMD channel layer 102 creating a P-type doping effect. Donating electrons to TMD channel layer 102 from encapsulation layer 104 may introduce shallow donor states close to a conduction band edge, leading to N-type doping effect.

In some embodiments, the encapsulation layer 104 further includes interstitials to facilitate charge transfer. In embodiments, the electron donor and acceptor levels may be controlled by changing the number of defects in the encapsulation layer 104. The number of defects may be controlled, for example, during deposition. Interstitials can result in charge centers in the encapsulation layer 104 and each interstitial site can advantageously accept or donate charge carriers to the TMD channel layer 102. In an embodiment, the number of defect sites is greater than 1e18 in the encapsulation layer 104. The interstitials may exist in various charged states depending on a material of the encapsulation layer 104. The charge carriers can be of both negative and positive polarity, thus facilitating fabrication of both N-FET and a P-FET devices.

However, it is to be appreciated that TMD channel layer may transfer electrons to the encapsulation layer 104 even if no significant defects are present in the encapsulation layer 104. The encapsulation layer 104 may be lattice matched with the TMD channel layer 102 to obtain band alignment between TMD channel layer 102 and the material of the encapsulation layer 104. Band alignment may promote transfer of charge between the encapsulation layer 104 and TMD material.

In embodiments the encapsulation layer 104 includes oxygen and at least one of aluminum, molybdenum or tungsten for example aluminum oxide, tungsten oxide, or molybdenum oxide. For a given TMD material, the material of the encapsulation layer 104 may be chosen to form an N-type FET or a P-type FET. In exemplary embodiments, tungsten oxide and molybdenum oxide favors P-type FET and aluminum oxide favors an N-type FET. In some embodiments, the encapsulation layer 104 is a sub-stoichiometric oxide of aluminum, tungsten or molybdenum aluminum oxide, tungsten oxide, or molybdenum oxide. A sub stoichiometric material may facilitate vacancy migration in the encapsulation layer 104. In some embodiments, the encapsulation layer 104 includes a metal that is different from a metal of the TMD channel layer 102. In other examples, the encapsulation layer 104 and the TMD channel layer 102 include a same metal.

In some embodiments, the TMD channel layer 102 may be intrinsically an N-type or a P-type semiconducting TMD. Examples of TMD channel layer 102 that exhibit P-type behavior include WSe$_2$, or WSe$_2$ doped with Ta. Examples of TMD channel material that exhibit N-type behavior include sulfides of Mo, W, Ti.

As the encapsulation layer 104 is designed to be a charge transfer layer, the encapsulation layer 104 includes a material that maybe different from a material of the gate dielectric layer 108. In embodiments, the gate dielectric layer 106 thickness between 1 nm and 4 nm. In embodiments, the encapsulation layer 104 has a thickness between 1 nm and 4 nm.

Figure 1C:
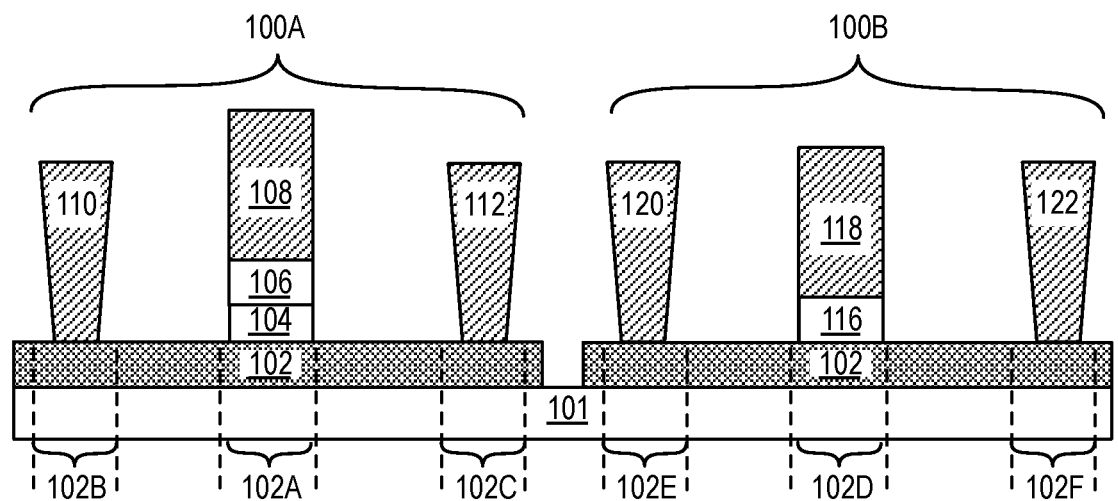
FIG. 1C is a cross-sectional illustration of a pair of N and P type TMD transistors, in accordance with an embodiment of the present disclosure.

FIG. 1C is a cross-sectional illustration of a pair of transistors including transistor 100A adjacent to transistor 100B, above a shared substrate 101. The transistors 100A and 100B may each have a planar or non-planar geometry. In the illustrative embodiment, each of the transistors 100A and 100B have a planar geometry. In the illustrative embodiment, transistor 100A is the same as transistor 100. In an embodiment, transistor 100A is an N-FET and transistor 100B is a P-FET. In other embodiments, transistor 100A is a P-FET and the transistor 100B is an N-FET. As shown, transistor 100B includes TMD channel layer 102, and a gate dielectric layer 116 on a portion 102D of the channel layer 102, between TMD channel layer 102 and gate electrode 118. The transistor 100B further includes a source contact 120 on a portion 102E of the TMD channel layer 102 and a drain contact 122 on a portion 102F of the TMD channel layer 102.

In an exemplary embodiment, transistor 100B has substantially the same features as transistor 100A, except that the transistor 100B includes no encapsulation layer. In one such exemplary embodiment, transistor 100A includes an Al$_2$O$_3$-encapsulation layer 104 and a WSe$_2$ TMD channel layer 102. In one such embodiment, transistor 100A exhibits N-FET behavior. In some such embodiment, transistor 100B with the WSe$_2$-TMD channel layer 102 exhibits a P-FET behavior due of an absence of the Al$_2$O$_3$-encapsulation layer 104.

In some embodiments, gate electrode 118 of transistor 100B includes a different material than a material of the gate electrode 108 of transistor 100A. Differences in gate electrode may be implemented to advantageously tune threshold voltage for respective N and P transistors.

Examples of gate electrode 108 include a metal such as ruthenium, palladium, platinum, cobalt, nickel, hafnium, zirconium, titanium, tantalum, aluminum, alloys of these metals, and nitrides or carbides of ruthenium, palladium, platinum, cobalt, nickel, hafnium, zirconium, titanium, tantalum, aluminum such as hafnium nitride, zirconium nitride, titanium nitride, tantalum nitride, and aluminum nitride, hafnium carbide, zirconium carbide, titanium carbide, tantalum carbide or aluminum carbide. Examples of gate electrode 118 include a metal such as ruthenium, palladium, platinum, cobalt, nickel, hafnium, zirconium, titanium, tantalum, aluminum, alloys of these metals, and nitrides or carbides of ruthenium, palladium, platinum, cobalt, nickel, hafnium, zirconium, titanium, tantalum, aluminum such as hafnium nitride, zirconium nitride, titanium nitride, tantalum nitride, and aluminum nitride, hafnium carbide, zirconium carbide, titanium carbide, tantalum carbide or aluminum carbide.

In some embodiments the gate dielectric layer 106 and gate dielectric layer 116 may be different. In an embodiment, the gate dielectric layers 106 or 116 each independently include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide or lead zinc niobate. In embodiments the gate dielectric layer 106 has a thickness between 0.8 nm and 4 nm.

In embodiments, the source contact 110 and drain contact 112 each include a same material. In some embodiments the source contact 120 and drain contact 122 each include a same material. In some embodiments, the source contact 110, drain contact 112, source contact 120 and drain contact 122 all include a same material.

Figure 1D:
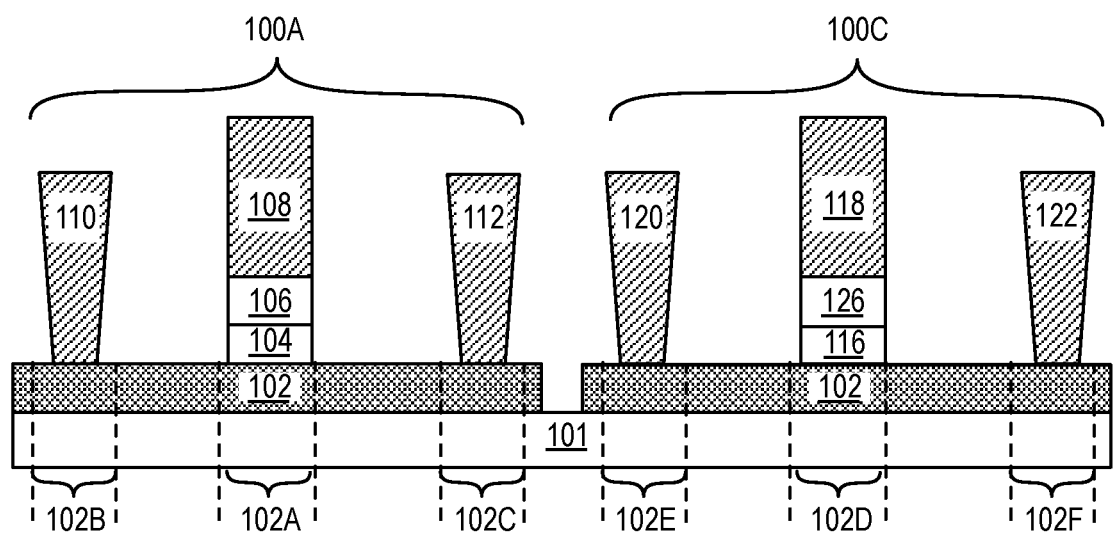
FIG. 1D is a cross-sectional illustration of a pair of N and P type TMD transistors, in accordance with an embodiment of the present disclosure.

In some embodiments, an N and a P type transistor may both include an encapsulation layer. FIG. 1D is a cross-sectional illustration of a pair of transistors 100A and 100C. In an embodiment, transistor 100C is substantially the same as transistor 100B with an inclusion of an encapsulation layer 126. In the illustrative embodiment, transistor 100C includes an encapsulation layer 126 between the gate electrode 118 and the gate dielectric layer 116, over the channel portion 102D. In embodiments, encapsulation layer 126 includes a different material from the material of the encapsulation layer 104. In exemplary embodiments, the encapsulation layer 126 introduce either shallow acceptor states or shallow donor states to TMD channel layer 102. In some such embodiments, encapsulation layer 126 introduces either shallow donor states or shallow acceptor states to TMD channel layer 102, producing an opposite effect of encapsulation layer 104.

In some examples, the encapsulation layer 104 includes oxygen and aluminum, or sub-stoichiometric aluminum oxide, and the encapsulation layer 126 includes oxygen and molybdenum or tungsten, or sub-stoichiometric tungsten oxide or molybdenum oxide, or vice versa.

In further specific examples, the TMD layer 102 includes sulfides of molybdenum, tungsten, titanium or chromium. In some such embodiments, the encapsulation layer 104 includes oxygen and aluminum, or sub-stoichiometric aluminum oxide, and the encapsulation layer 126 includes oxygen and molybdenum or tungsten, or sub-stoichiometric tungsten oxide or molybdenum oxide, or vice versa. One exemplary embodiment, TMD channel layer 102 includes $WS_2$ and encapsulation layer 104 includes aluminum oxide and the encapsulation layer 126 includes tungsten oxide.

Referring again to FIG. 1A, in an embodiment, the source contact 110 includes a barrier layer and a fill metal confined within the barrier layer. In some examples, the barrier layer includes a material such as tantalum nitride or ruthenium. In some examples, the fill metal 110 includes a material such as cobalt, copper or tungsten. In the illustrative embodiment, the drain contact 112 includes a barrier layer and a fill metal confined within the barrier layer. In some examples, the barrier layer includes a material such as tantalum nitride or ruthenium. In some examples, the fill metal includes a material such as cobalt, copper or tungsten.

In an embodiment, the substrate 101 includes a suitable semiconductor material such as but not limited to, single crystal silicon, polycrystalline silicon and silicon on insulator (SOI) material, where a trilayer stack includes a layer of silicon oxide between two layers of monocrystalline silicon.

In another embodiment, substrate 101 includes semiconductor materials such as germanium, silicon germanium or a suitable group III-N or a group III-V compound. Logic devices such as MOSFET transistors and access transistors and may also be formed on or above substrate 101.

Figure 2A:
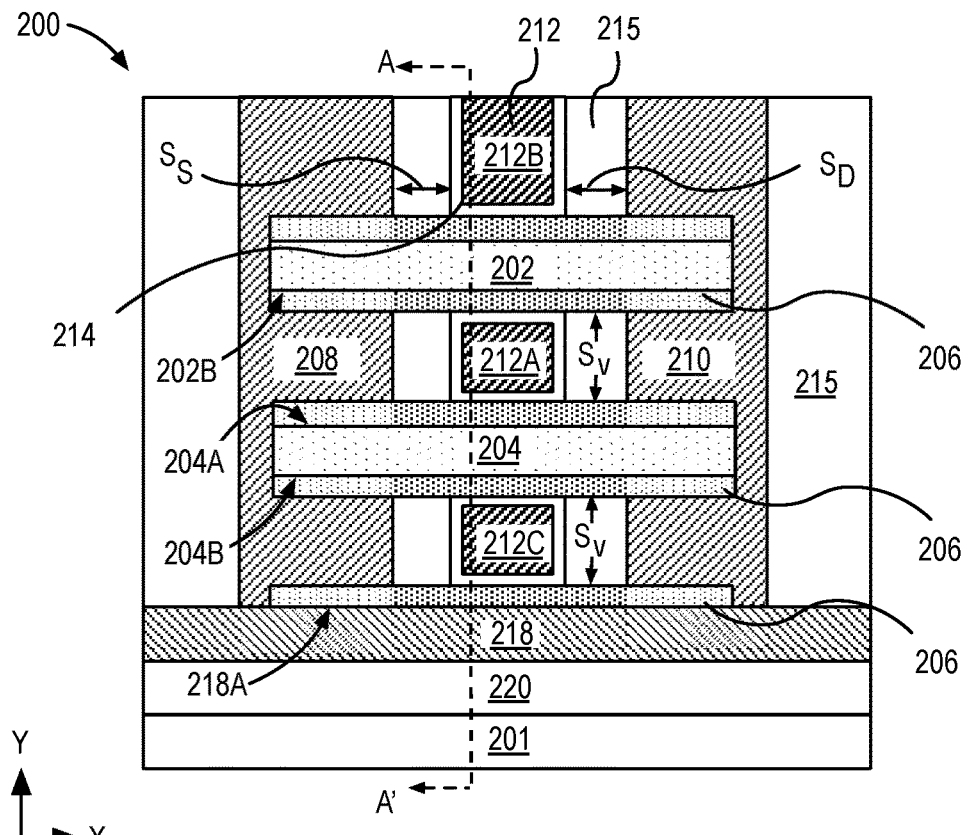
FIG. 2A is cross-sectional illustration of a transistor including a first TMD channel and second TMD channel above the first TMD channel and an encapsulation layer adjacent to each TMD channel in accordance with an embodiment of the present disclosure.

FIG. 2A is a cross-sectional illustration of a transistor 200 above a substrate 201. The transistor 200 includes a channel layer 202 over a channel layer 204, where each of the channels 202 and 204, include a stack of two or more layers of monocrystalline transition metal dichalcogenide (TMD) materials, (herein TMD channel layer 202 and TMD channel layer 204). In an embodiment, the TMD channel layers 202 and 204 each include a first metal. The transistor 200 further includes an encapsulation layer 206 including a second metal adjacent to the TMD channel layer 202 and TMD channel layer 204. In exemplary embodiments, TMD channel layers 202 and 204 include a same material for optimal transistor behavior. A source contact 208 is coupled to a first end of the TMD channel layers 202 and 204 and a drain contact 210 is coupled to a second end of the TMD channel layers 202 and 204, as shown. A gate electrode 212 is between the source contact 208 and the drain contact 210 and further between the TMD channel layer 202 and TMD channel layer 204. A gate dielectric layer 214 is between the gate electrode 212 and the encapsulation layer 206.

The encapsulation layer 206 is substantially the same as the encapsulation layer 104. As discussed above in association with FIG. 1A, the encapsulation layer and TMD channels include materials that can influence the FET characteristics of a transistor. As such, the combinations of material utilized for encapsulation layer 104 and TMD channel layer 102 to obtain embodiments of N and P-type transistor 100, may be equally applicable for encapsulation layer 206 and TMD channel layers 202 and 204 for transistor 200 described in FIG. 2A. In exemplary embodiments, the TMD channel layers 202 and 204 each include a same material. In some embodiments, TMD channel layers 202 and 204 include a metal that is different from a metal of encapsulation layer 206.

In the illustrative embodiment, the TMD channel layers 202 and 204 each have a thickness between 1 and 4 monolayers. In embodiments, each of the TMD channel layers 202 and 204 can have a same number of monolayers of TMD material or be different. In embodiments, where the TMD channel layers 202 and 204 are a single monolayer thick, the encapsulation layer 206 is on an upper and on a lower most surface of each TMD channel layers 202 and 204. In embodiments where each of the TMD channel layers 202 and 204 have a thickness that is greater than or equal to 2 monolayers the encapsulation layer 206 is also on sidewalls of the TMD channel layer 202 and TMD channel layer 204 as shown in FIG. 2B.

Figure 2B:
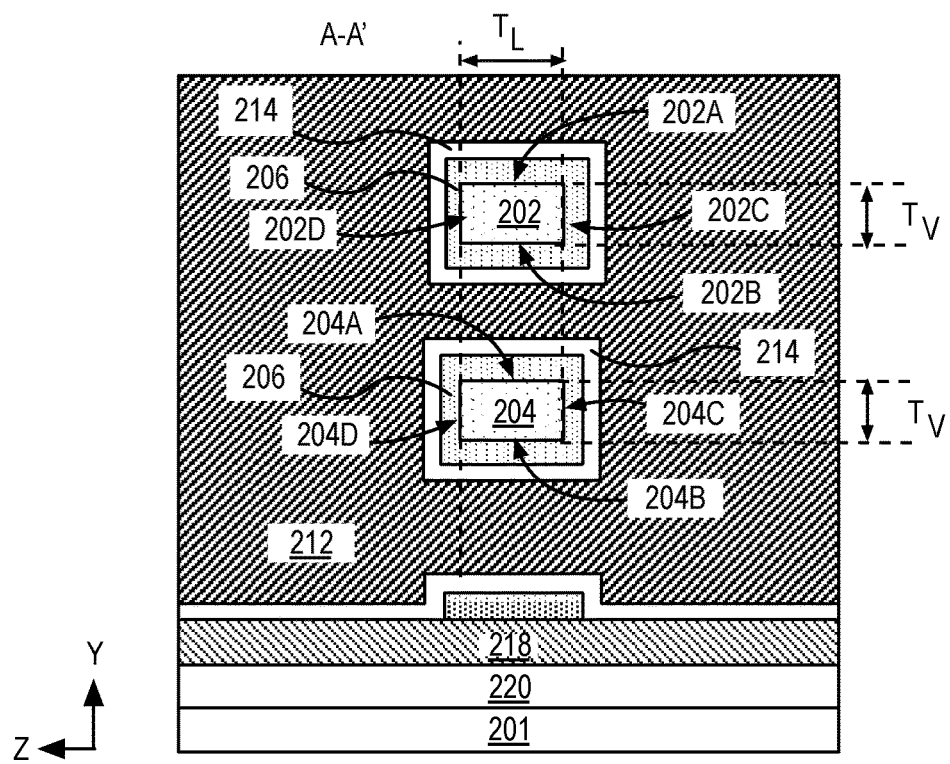
FIG. 2B is a cross-sectional illustration along the line A-A' of the structure in FIG. 2A, where the encapsulation layer clads the TMD channels and a gate dielectric clads the encapsulation layer, and the gate electrode clads the gate dielectric layer.

FIG. 2B is a cross-sectional illustration through a line A-A'. As shown, the TMD channel layer 202 has a rectangular cross-sectional profile, with a top surface 202A, a bottom surface 202B and sidewall surfaces 202C and 202D. An encapsulation layer 206 on sidewalls of TMD channel layer 202 can advantageously provide an increased surface for charge transfer. In an embodiment, the TMD channel layer 202 has a first crystallographic orientation on top surface 202A and on bottom surface 202B. The sidewall surfaces 202C and 202D may have a second crystallographic orientation. In an embodiment, the first crystallographic orientation is different from the second crystallographic orientation. The TMD channel layer 202 has a vertical thickness, $T_V$, as measured from surface 202B (along Y-direction), between 1.4 and 2.8 nm. In embodiments, the TMD channel layer 202 has a lateral thickness, $T_L$, as measure from sidewall surface 202C, (along Z-direction) between 5 nm and 60 nm.

In an embodiment, the encapsulation layer 206 is at least on the top surface 202A and on bottom surface 202B. In the illustrative embodiment, encapsulation layer 206 is top surface 202A, bottom surface 202B and on sidewall surfaces 202C and 202D. In an embodiment, the encapsulation layer 206 is sufficiently lattice matched to the first crystallographic orientation of the TMD channel layer 202. In an embodiment, the encapsulation layer 206 has a vertical thickness (as measured away from surfaces 202A or 202B) between 1 and 2 nm. In an embodiment, the encapsulation layer 206 is lattice matched to the second crystallographic orientation of the sidewall surfaces 202C and 202D. In an embodiment, the encapsulation layer 206 on sidewalls surfaces 202C and 202D has a lateral thickness (as measured away from sidewall surface 202C and 202D, respectively) between 1 nm and 2 nm.

In embodiments, TMD channel layer 204 has one or more properties of the TMD channel layer 202 described above, such as the material composition, crystallographic orientation, and lateral and vertical thicknesses, $T_V$ and $T_L$, respectively. As shown, the TMD channel layer 204 has a rectangular cross-sectional profile, with a top surface 204A, a bottom surface 204B and sidewall surfaces 204C and 204D.

In an embodiment, the encapsulation layer 206 is on at least the top surface 204A and on bottom surface 204B. In the illustrative embodiment, encapsulation layer 206 is top surface 204A, bottom surface 204B and on sidewall surfaces 204C and 204D. In the illustrative embodiment, In an embodiment, the encapsulation layer 206 is lattice matched to the first crystallographic orientation of the material of TMD channel layer 204. In an embodiment, the encapsulation layer 206 has a vertical thickness (as measured from surfaces 204A or 204B) between 1 and 2 nm.

In an embodiment, the encapsulation layer 206 is lattice matched to the second crystallographic orientation of the sidewall surfaces 204C and 204D. In an embodiment, the encapsulation layer 206 on sidewall surfaces 204C and 204D, has a lateral thickness (as measured away from sidewall surface 204C and 204D, respectively) between 1 and 2 nm.

As shown, the gate dielectric layer 214 clads the encapsulation layer 206. In the illustrative embodiment, the gate electrode 212 clads the gate dielectric layer 214 and extends continuously between TMD channel layer 202 and TMD channel layer 204.

Referring again to FIG. 2A, the source contact 208 and the drain contact 210 are each spaced apart from the gate electrode 212 by a dielectric 215. The dielectric 215 has a lateral thickness, $S_S$ and $S_D$, respectively. In some embodiments, $S_S$ and $S_D$ are 5 nm or less. $S_S$ and $S_D$ of less than 5 nm or less may be desirable to reduce external resistance in the transistor 200. Dielectric 215 is an insulator that can provide sufficient electrical isolation and includes silicon and one or more of oxygen, carbon or nitrogen.

As shown, the encapsulation layer 206 is in contact with the source contact 208 and drain contact 210. In some embodiments, depending on the material of the source contact 208 or the drain contact 210, encapsulation layer 206 may advantageously reduce a Schottky barrier height between each of the TMD channel layers 202 and 204 and the respective source contact 208 and drain contact 210. Reduction in Schottky barrier height may facilitate reduction in contact resistance.

In the cross sectional illustration, the gate electrode 212 includes a gate electrode portion 212B above the TMD channel layer 202, a gate electrode portion 212C between TMD channel layer 204 and template layer 218, and a gate electrode portion 212A between TMD channel layers 202 and 204. The different gate electrode portions 212A, 212B, and 212C are physically and electrical coupled electrically as discussed above.

In an embodiment, the gate electrode 212 includes one or more layers, where a first layer in contact with the gate dielectric layer 214 is a work function electrode and a second layer in contact with the work function electrode is a fill metal. As shown, TMD channel layers 202 and 204 are spaced apart vertically by a distance $S_V$. $S_V$ may be chosen to accommodate a combined thickness of the encapsulation layer 206, the gate dielectric layer 214 and at least a work function portion of gate electrode 212 (in embodiments where multiple gate materials are utilized). In embodiments, gate electrode 212 includes a same material as gate electrode 108, and gate dielectric layer 214 includes a same material as the material of the gate dielectric layer 106, described in association with FIG. 1A.

Referring again to FIG. 2A, depending on $S_V$, some gate electrode portions such as gate electrode portion 212A and 212C may only include a work function electrode, while gate electrode portion 212B may include a work function electrode and a fill metal. It is advantageous for the relative space, $S_V$, between surface 202B and surface 204A, and between surfaces 204B and 218A (uppermost surface of template layer 218) to have a vertical thickness that sufficiently minimizes gate capacitance. In embodiments, the height $S_V$, is between 10 nm and 20 nm to provide sufficient space to form gate dielectric layer 214, gate electrode 212, encapsulation layer 206 and minimize gate capacitance.

In an embodiment, the TMD channel layer 202 and TMD channel layer 204 each have a crystal orientation that is substantially matched to one or more underlying material. In the illustrative embodiment, TMD channel layer 202 and TMD channel layer 204 are substantially lattice matched to a plurality of templating and buffer layers where each templating and buffer layer includes a group III-Nitride (III-N) material. In an embodiment, transistor 200 includes the template layer 218 in contact with the source contact 208 and drain contact 210, and buffer layer 220 directly below and in contact with the template layer 218.

In an embodiment, the template layer 218 includes a binary or a ternary III-N material, such as gallium nitride (GaN), one or more ternary alloys of GaN, such as AlGaN, or a quaternary alloy of GaN including at least one group III element and nitrogen, such as $In_XAl_YGa_{1-X-Y}N$, where "X" ranges from 0.01-0.1 and "Y" ranges from 0.01-0.1. In some embodiments, the templating layer 218 includes AlInN The template layer 218 provides a template for hexagonal crystal in TMD channel layer 202 and TMD channel layer 204. The template layer 218 is an electrically non-conductive layer. In the illustrative embodiment, the encapsulation layer 206 is in direct contact with an uppermost surface 218A of the template layer.

In an embodiment, the buffer layer 220 includes a single layer of AlN. In embodiments, the thickness of the AlN buffer layer 220 is between 100 nm and 400 nm. In an embodiment, the substrate 201 includes a single crystal silicon, or a silicon on insulator (SIO) substrate.

For a given TMD material, the material of the encapsulation layer 206 may be chosen to form an N-type FET or a P-type FET. As such, two stacked nanosheet TMD transistors such as transistor 200 with a same TMD material but different encapsulation material may be adjacent to each other on a same plane of a shared substrate to obtain a complimentary N-FET and P-FET.

Figure 2C:
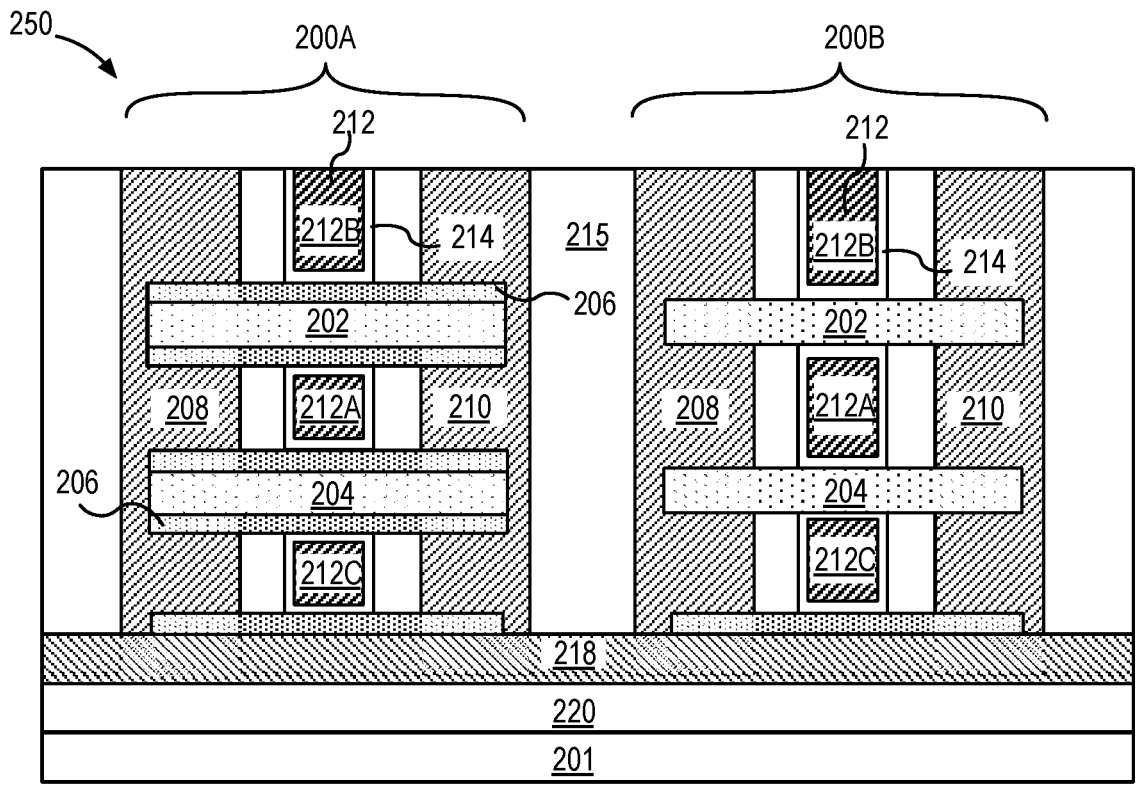
FIG. 2C is a cross-sectional illustration of a pair of N and P type TMD transistors, in accordance with an embodiment of the present disclosure.

FIG. 2C is a cross-sectional illustration of a transistor array 250 including transistor 200A adjacent to transistor 200B, above a shared substrate 201. As shown, transistor 200A is electrically isolated from transistor 200B by dielectric 215.

In the illustrative embodiment, transistor 200A is the same as transistor 200. In an embodiment, transistor 200A is an N-type FET and transistor 200B is a p-type FET. In other embodiments, transistor 200A is a P-type FET and the transistor 200A is an N-type FET. As shown transistor 200B includes TMD channel layers 202 and 204, gate dielectric layer 214 adjacent to each of the TMD channel layers 202 and 204, and a gate electrode 212 adjacent to the gate dielectric layer 214. The transistor 200B further includes a source contact 208 in contact with TMD 202 and 204, and a drain contact 210 in contact with TMD channel layers 202 and 204.

In an exemplary embodiment, transistor 200B has substantially the same features as transistor 200A, except that the transistor 200B includes no encapsulation layer 206. In one such exemplary embodiment, transistor 200A includes an $Al_2O_3$-encapsulation layer 206 and a $WSe_2$ TMD channel layers 202 and 204. In one such embodiment, transistor 200A exhibits N-FET behavior. In some such embodiment, transistor 200B with $WSe_2$ TMD channel layers 202 and 204 exhibits a P-FET behavior because of an absence of the $Al_2O_3$-encapsulation layer 206.

In embodiments source contact 208 and drain contact 210 each include a material of the source contact 110 or drain contact 112 described in association with FIG. 1A.

Figure 2D:
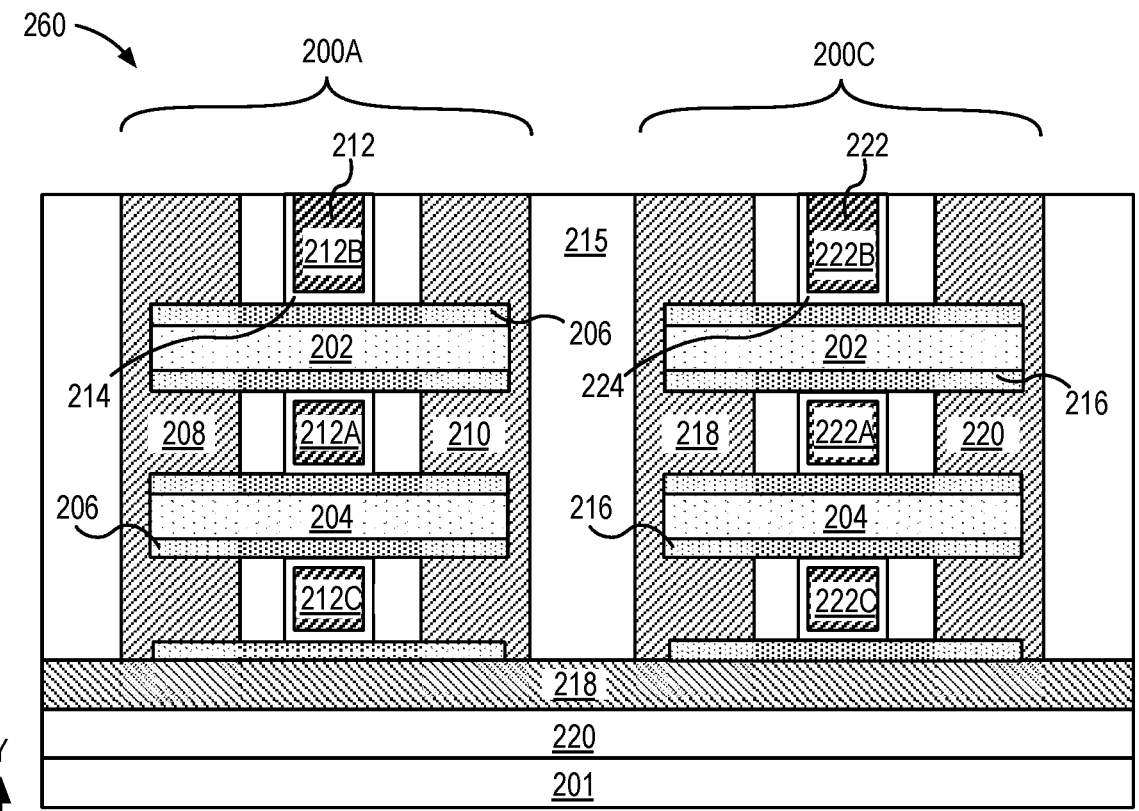
FIG. 2D is a cross-sectional illustration of a pair of N and P type TMD transistors, in accordance with an embodiment of the present disclosure.

In some embodiments, an N and a P type transistor may both include an encapsulation layer. FIG. 2D is a cross-sectional illustration of a transistor array 260 including transistor 200A adjacent to transistor 200C, above a shared substrate 201. In the illustrative embodiment, transistor 200A is the same as transistor 200. In an embodiment, transistor 200A is an N-type FET and transistor 200B is a p-type FET. In other embodiments, transistor 200A is a P-type FET and the transistor 200A is an N-type FET. As shown transistor 200B includes TMD channel layers 202 and 204, an encapsulation layer 216 adjacent to each of the TMD channel layers 202 and 204, and a gate dielectric layer 224 adjacent to the encapsulation layer 216 and between the encapsulation layer 216 and gate electrode 222. In exemplary embodiments, encapsulation layers 206 and 216, each include a different metal.

In further specific examples, the TMD channel layers 202 and 204 each include sulfides of molybdenum, tungsten, titanium or chromium. In some such embodiments, the encapsulation layer 206 includes oxygen and aluminum, or sub-stoichiometric aluminum oxide, and the encapsulation layer 216 includes oxygen and molybdenum or tungsten, or sub-stoichiometric tungsten oxide or molybdenum oxide, or vice versa. In some exemplary embodiments, TMD channel layers 202 and 204 each include $WS_2$ and encapsulation layer 206 includes aluminum oxide and the encapsulation layer 216 includes tungsten oxide.

In embodiments, gate electrode 222 includes a material that is the same or substantially the same as the material of the gate electrode 212. In other embodiments, gate electrode 222 of transistor 200C includes a different material than a material of the gate electrode 212 of transistor 200A. Different gate electrode materials may be implemented to advantageously tune threshold voltage for respective N and P transistors. In embodiments gate dielectric layer 224 includes a material that is the same or substantially the same as the material of the gate dielectric layer 106 described in association with FIG. 1A.

Referring again to FIG. 2D, in embodiments, gate dielectric layer 224 includes a material that is the same or different from a material of the gate dielectric layer 216. Examples of gate dielectric materials include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide or lead zinc niobate. In embodiments the gate dielectric layers 214 and 224 each have a thickness between 0.8 nm and 4 nm. The gate dielectric layers 214 and 224 may have a same or different thicknesses.

The transistor further includes a source contact 218 in contact with TMD 202 and 204, and a drain contact 220 in contact with TMD 202 and 204. In embodiments, source contact 218 and drain contact 220 each include a material that is the same or substantially the same as the material of the source contact 208 and drain contact 210.

FIG. 3 is a method 300 to fabricate a transistor depicted in FIG. 2A, in accordance with an embodiment of the present disclosure. The method 300 begins at operation 310 by patterning a material layer stack comprising a layer of a III-N material on a plurality of bilayers into a block having sidewalls. The method 300 continues at operation 320 by forming a dielectric adjacent to the block. The method 300 continues at operation 330 with a process of etching and remove a portion of the dielectric to form an exposed portion of the block and etching and removing the layer of III-N material to suspend a plurality of channel layers in the exposed portion of the block. The method 300 continues at operation 340 with formation of a liner to clad the plurality of channel layers in the exposed portion of the block. The method 300 continues at operation 350 with the formation of a gate between each of plurality of channel layers in a first portion of the exposed portion of the block. The method 300 concludes at operation 360 with the formation of a first contact in a second portion of the block and a second contact in a third portion of the block, wherein the first portion is between the second portion and the third portion.

Figure 4A:
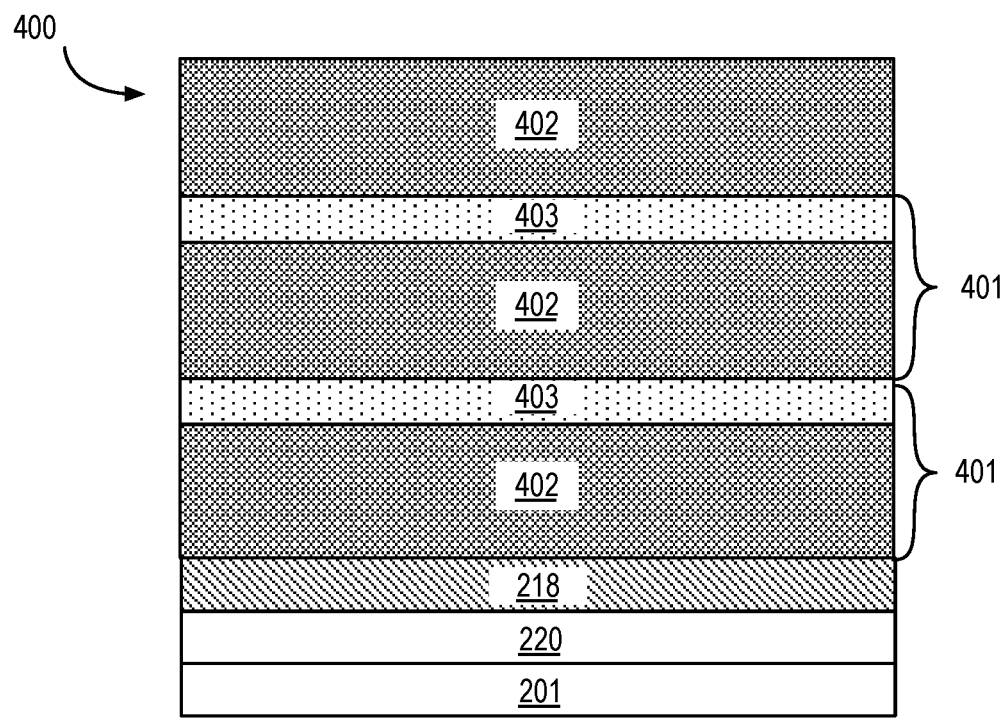
FIG. 4A is a cross-sectional illustration of material layer stack for fabrication of a TMD transistor device, where the material layer stack includes a plurality of bilayers of a TMD layer on a sacrificial layer, in accordance with an embodiment of the present disclosure.

FIG. 4A is a cross-sectional illustration of material layer stack 400 for fabrication of a TMD transistor device, in accordance with an embodiment of the present disclosure. As shown, a buffer layer 220 is formed on the substrate 201.

In an embodiment, the buffer layer 220 is formed to overcome lattice and thermal mismatch between the substrate 201 and a group III-N semiconductor material to be formed above. The buffer layer 220 may be grown on the substrate 201 by a metal organic chemical vapor deposition (MOCVD) process at a temperature in the range of 1000-1100 degrees Celsius. Depending on embodiments, the buffer layer 220 includes nitrogen and one or more of, Al, In or Ga, for example $Al_zGa_{1-z}N$, $Al_wIn_{1-w}N$, or AlN. In exemplary embodiments buffer layer 220 includes AlN. In an embodiment, an AlN buffer layer 220 has a hexagonal wurtzite structure. The buffer layer 220 including AlN may be grown to a thickness between 25 nm and 100 nm. In other embodiments, the buffer layer 220 includes a plurality of layers of III-N materials above the substrate 201. The layers may be interleaved with two or more layers of III-N materials such as but not limited to $Al_zGa_{1-z}N$, $Al_wIn_{1-w}N$, or AlN.

The template layer 218 is formed on the buffer layer 220. In an embodiment, the template layer 218 is formed by an MOVCD epitaxy process. The template layer 218 is deposited to a thickness between 10 nm and 50 nm. In an embodiment, the template layer 218 is a layer of GaN. In an embodiment, the GaN template layer 218 is grown to a thickness that is between 100 nm and 400 nm. A GaN template layer 218 may have a defect density less than (1e10/cm2) when grown to a thickness of at least 100 nm.

The process continues with formation of a material layer stack 400 having a plurality of bilayers 401 on the template layer 218. In the illustrative embodiment, two bilayers 401 are shown. In the illustrative embodiment, each bilayer includes a layer 402 and a layer 403 on layer 402, where layer 403 includes a TMD material. As shown, material layer stack 400 further includes another layer of layer 402 on layer 403.

In an embodiment, the layer 402 includes a group III-N material. In an exemplary embodiment, layer 402 includes nitrogen and one or more of Al or In. In an exemplary embodiment, layer 402 includes AlN. An AlN layer 402 can be grown by MOCVD epitaxially on the template layer 218 and provides a surface for graphoepitaxy growth of the TMD layer 403. In embodiments, the TMD layers 403 have a substantially the same crystal structure as an AlN layer 402. In embodiments where the AlN layer 402 is single crystalline, templating a TMD layer 403 off the AlN layer 402, facilitates optimizing grain size of the TMD layer 403. The layer 402 also provides sufficiently high etch selectivity (greater than 5:1) relative to the template layer 218. In embodiments, AlN layer 402 is grown to a thickness of at least 6 nm.

The TMD layer 403 is formed on layer 402, where TMD layer 403 includes a material of the TMD channel layer 202 or TMD channel layer 204 (described in association with FIG. 2A). Depending on embodiments, TMD layer 403 has a thickness that is between 1 to 4 monolayers. The TMD layer 403 is formed by an MOCVD or a CVD process. The TMD layer 403 is formed on a top surface of layer 402 as shown. In an embodiment, the TMD layer is synthesized by a chemical vapor deposition process (CVD) or a molecular beam epitaxy process (MOCVD) process. Depending on processing embodiments, chemical synthesis uses a solid or a gaseous precursor. In one embodiment, a CVD process utilizes a solid precursor such as a transition metal oxide and a pure chalcogen to coat exposed surface of layer 402. A CVD furnace may be utilized to form the TMD layer 403, where the TMD layer 403 may be deposited at a process temperature of at least 600 degrees Celsius. In MOCVD embodiments, chemical synthesis utilizes a gaseous precursor and the TMD layer 403 is deposited at a process temperature of at least 300 degrees Celsius. In an embodiment, the process utilized to form the TMD layer forms a single monolayer of TMD layer 403. The material layer stack 400 includes a same TMD material within each bilayer 401 and is formed to a substantially same thickness. In some embodiments, a layer 403 including 2 to 4 monolayers of TMD is formed on each layer 402. In other embodiments, layer 403 has different thicknesses from one bilayer 401 to the next. In an embodiment, the process to form the bilayer 401 is repeated until a desired number of TMD channel layers is formed. While two bilayers 401 are shown, the number of bilayers can be between 2-10.

Figure 4B:
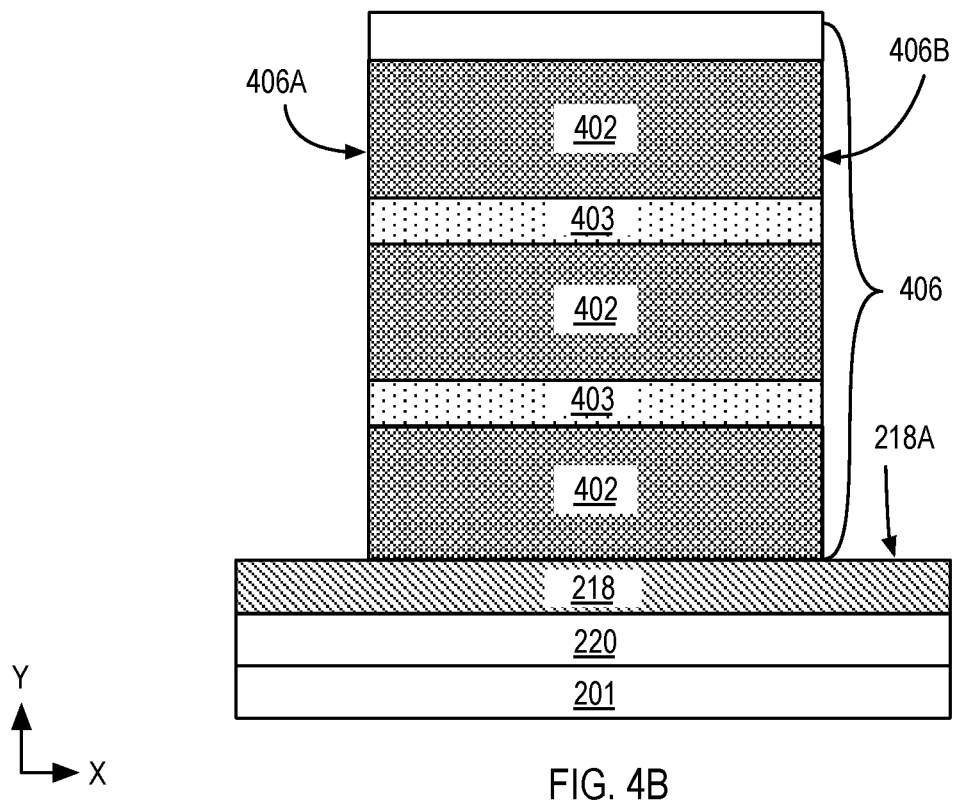
FIG. 4B is a cross sectional illustration of a block formed by patterning the material layer stack.

FIG. 4B is a cross sectional illustration of a block 406 formed by patterning the material layer stack 400 depicted in FIG. 4A. In an embodiment, a plasma etch process may be utilized to pattern the material layer stack 400 into a block 406. In exemplary embodiments, the sidewalls 406A and 406B of the block 406 are substantially vertical with respect to an uppermost surface 218A, as shown. The patterning process carried out to etch the block 406, etches the lowermost layer 402 directly above template layer 218. The etch process is halted after exposure of the template layer 218.

Figure 5A:
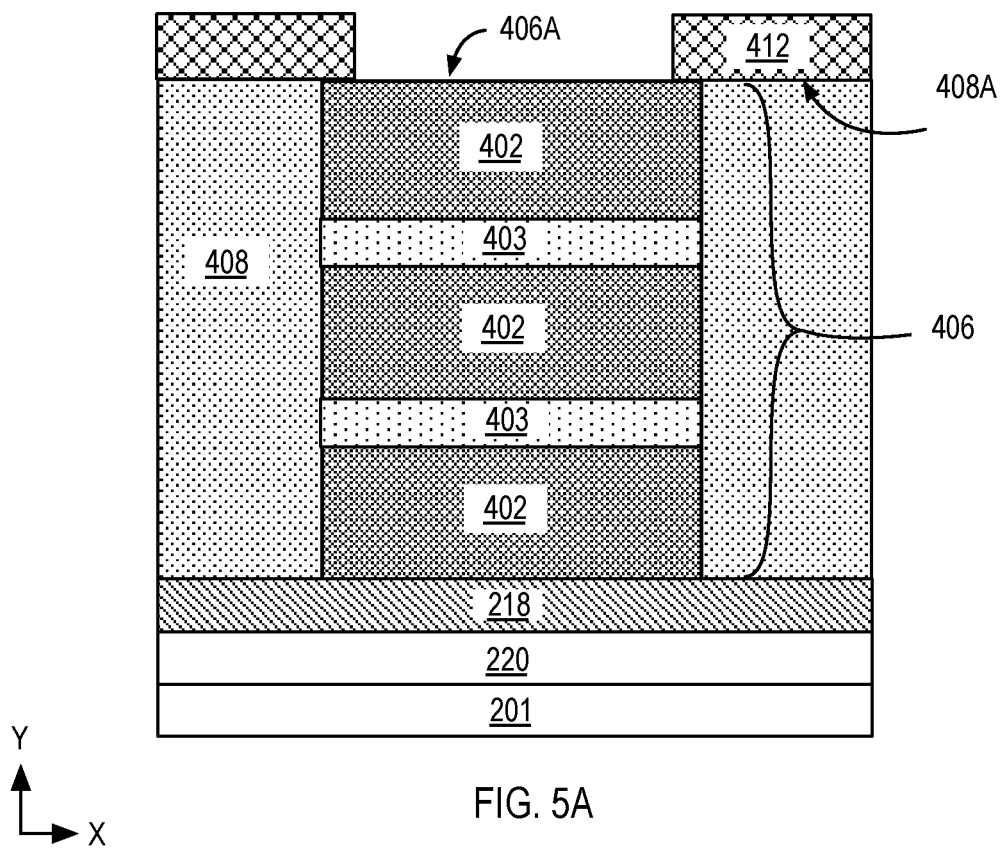
FIG. 5A illustrates the structure of FIG. 5B following the formation of a dielectric on the block and following the formation of a mask to form an opening adjacent to portions of sidewalls of the block.
Figure 5B:
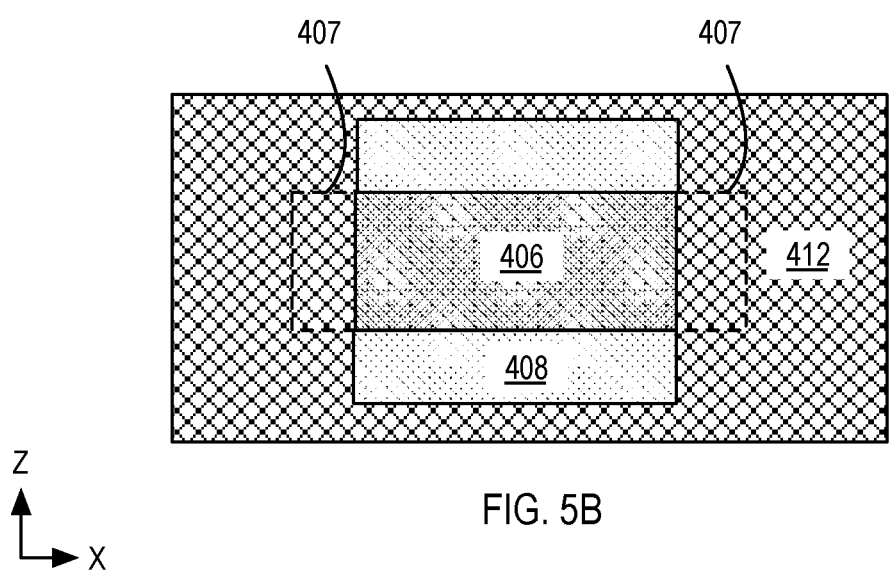
FIG. 5B is a plan-view illustration of the structure in FIG. 5A.

FIG. 5A illustrates the structure of FIG. 4B following the formation of a dielectric 408 on the block and following the formation of a mask 412. In an embodiment, the dielectric 408 includes a material that can provide electrical isolation. Examples of dielectric 408 include silicon and one or more of nitrogen, oxygen or carbon.

In the illustrative embodiment, a dielectric 408 is deposited on and surrounds the block 406. After deposition, the dielectric 408 may be planarized. In an embodiment, dielectric 408 is planarized using a chemical mechanical polish (CMP) process. As shown, the dielectric 408 may be planarized until an uppermost surface 408A of the dielectric 408 is coplanar or substantially coplanar with an uppermost surface 406A of the block 406. A mask 412 is formed on top of the dielectric 408 and on a portion of the block 406. A plan view depicting a shape of the mask 412 and exposed block 406 is illustrated in FIG. 4B. Pair of dashed lines 407 indicate portions of the block 406 that are covered by the mask 412.

Figure 6A:
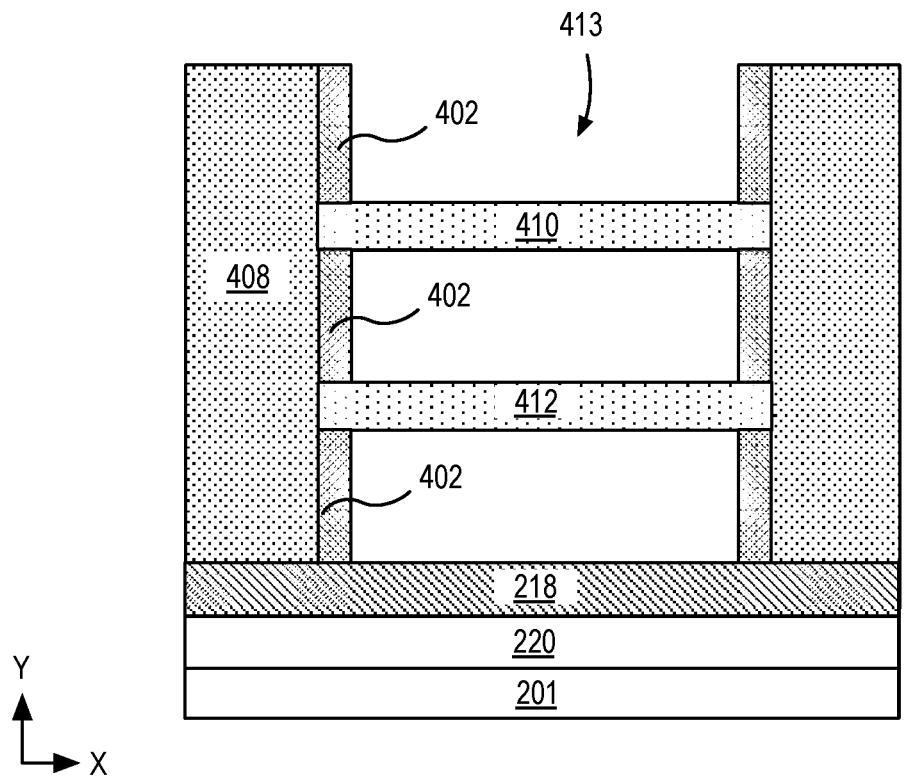
FIG. 6A is a cross-sectional illustration of a plurality of TMD channel layers formed after etching the dielectric, exposing sidewalls of the block, and selectively removing the sacrificial III-N material.

FIG. 6A is a cross-sectional illustration of a plurality of nanosheets formed above a substrate 201. In the illustrative embodiment, the dielectric 408 is patterned and the mask 412 is removed. The patterning process creates an opening 413.

The layer 402 from each bilayer is selectively removed. In an embodiment, a wet chemical etch, a vapor etch process, or a combination thereof is utilized to selectively remove the layer 402. The process of removing the layer 402 from each bilayer forms TMD channel layers 410 and 412 as shown. The TMD channel layers 410 and 412 remain anchored to the dielectric 408 after the selective etch process. Portions of the layer 402 that were covered by the mask during the dielectric etch process may remain adjacent to the dielectric 408, such as is illustrated. In other embodiments, layer 402 is completely removed. In embodiments, TMD channel layers 410 and 412 include one or more properties of the TMD channel layers 202 and 204, such as material and thickness, described in association with FIGS. 2A and 2B.

Figure 6B:
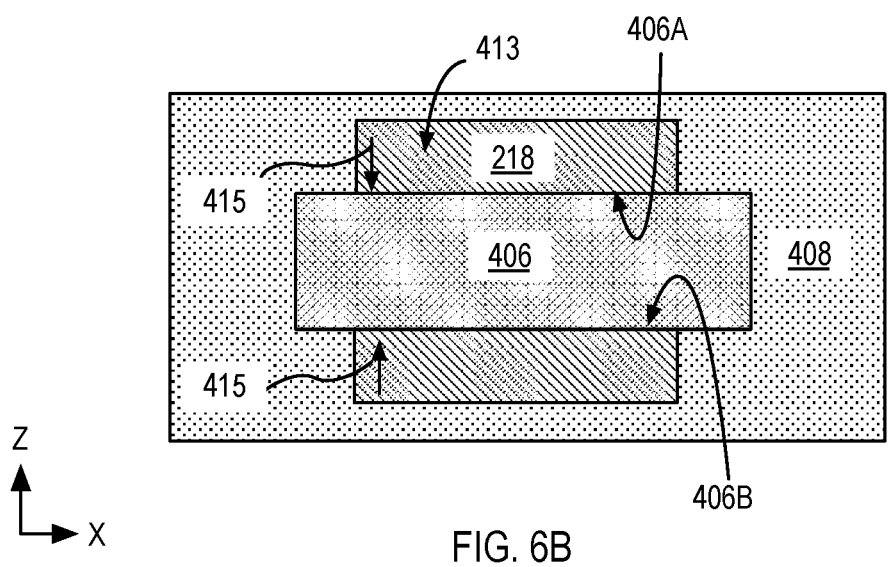
FIG. 6B is a plan-view illustration of the structure in FIG. 6A.

FIG. 6B is a plan-view illustration of the structure in FIG. 6A. As shown template layer 218 is exposed by the etch process. The etch process also exposes sidewalls 406A and 406B of the block 406, as is shown in FIG. 6B. Exposing the sidewalls 406A and 406B are important for the process of releasing the layer 402. In the illustrative embodiment, the etch process removes portions of the layer 402 from the sidewalls 406A and 406B and etches inward as indicated by arrows 415 along the +/−z-direction, in the Figure.

Figure 7A:
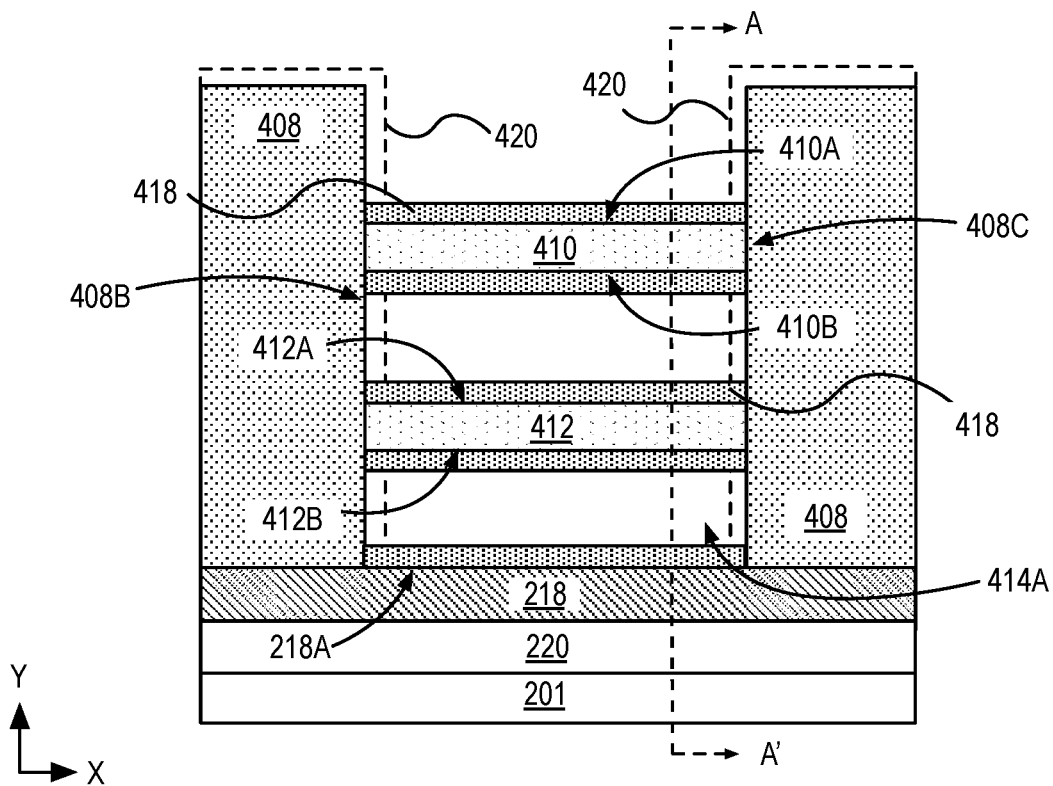
FIG. 7A is a cross-sectional illustration of the process to form an encapsulation layer on each of the TMD channel layers.

FIG. 7A is a cross-sectional illustration of the structure in FIG. 6A following the process to form an encapsulation layer 418 on each of the TMD channel layers 410 and 412. In an embodiment, an encapsulation layer 418 is formed by a CVD or an atomic layer deposition (ALD) process. In some embodiments, the encapsulation layer 418 is formed selectively on uppermost surface 410A and on lowermost surface 410B of the TMD channel layer 410. As shown, encapsulation layer 418 is also formed selectively on uppermost surface 412A and lowermost surface 412B of TMD channel layer 412. In the illustrative embodiment, the encapsulation layer 418 is also formed on uppermost surface 218A of template layer 218. In some embodiments, the encapsulation layer 418 is also formed on sidewalls 408B and 408C and on uppermost surface 408A of the dielectric 408 (as indicated by dashed lines 420). The encapsulation layer 418 may be lattice matched with the TMD material to obtain band alignment between TMD material and the material of the encapsulation layer 418. Band alignment may promote transfer of charge between the encapsulation layer 418 and TMD material. In some embodiments, the encapsulation layer 418 is deposited to a thickness of 1 nm and 3 nm.

The encapsulation layer 418 may be chosen to form an N-type FET or a P-type FET. In an embodiment, the encapsulation layer 418 includes oxygen and one of aluminum, molybdenum or tungsten, for e.g., aluminum oxide, tungsten oxide, or molybdenum oxide. In other embodiments, the encapsulation layer 418 includes a sub-stoichiometric aluminum oxide, tungsten oxide, or molybdenum oxide. The encapsulation layer 418 is designed to attract electrons from or donate electrons to the TMD channel layers 410 and 412. Attracting electrons from the encapsulation layer 418 may introduce shallow acceptor states close to the valence band edge of the TMD channel layers 410 and 412 creating a P-type doping effect. Donating electrons to TMD channel layers 410 and 412 from encapsulation layer 418 may introduce shallow donor states close to a conduction band edge, leading to N-type doping effect. In embodiments, control of the electron donor and acceptor level may be controlled by changing the level of defects in the encapsulation layer 418. In some embodiments, the encapsulation layer 418 is deposited with a defect level of greater than 1e13/cm$^2$.

The TMD channel layers 410 and 412 may be intrinsically N-type or P-type semiconducting TMDs. N-type TMD channel layers 410 and 412 include for e.g., sulfides of Mo, W, Ti. In some such embodiments, deposition of an encapsulation layer 418 including tungsten oxide may enable P-type doping effect in an N type TMD nanosheet transistor.

In some exemplary embodiments, TMD channel layers 410 and 412 includes $WSe_2$. A transistor fashioned from a $WSe_2$ TMD channel layers 410 and 412 may exhibit P-type behavior. In some such embodiments, an encapsulation layer 418 including Al and O, e.g., $Al_2O_3$, can result in P-type $WSe_2$ TMD channel layers 410 and 412 to exhibit N-type behavior in a TMD transistor during voltage biasing.

Figure 7B:
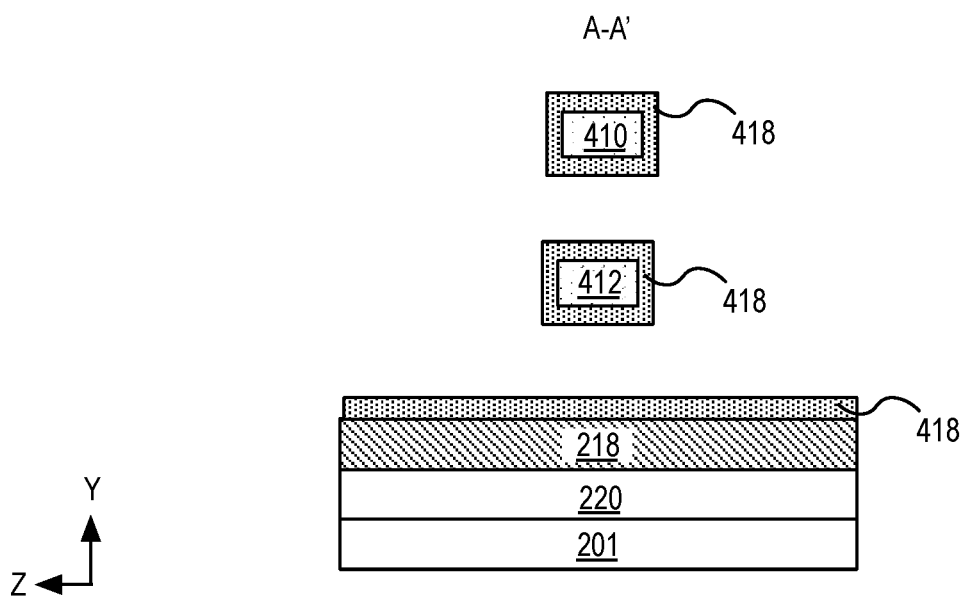
FIG. 7B is a cross-sectional illustration along a line A-A' through the structure in FIG. 7A.

FIG. 7B is a cross-sectional illustration along a line A-A' through the structure in FIG. 7A. In embodiments, where the TMD channel layers 410 and 412 each include more than one monolayer, the cross sectional profile of the TMD channel layers 410 and 412 can be rectangular as illustrated (and described in association with FIG. 2B). In some embodiments, an atomic layer deposition (ALD) process to entirely clad the TMD channel layers 410 and 412 with the encapsulation layer 418, as shown.

It is to be appreciated that in embodiments, an N and a P type TMD nanosheet transistor may be co-fabricated. In one example, TMD layers in multiple transistor structures may be released. An encapsulation layer may be formed on a selected transistor structure after masking a different transistor structure. In a second embodiment, TMD layers are released in a first transistor structure, while a second transistor structure is masked.

Figure 8:
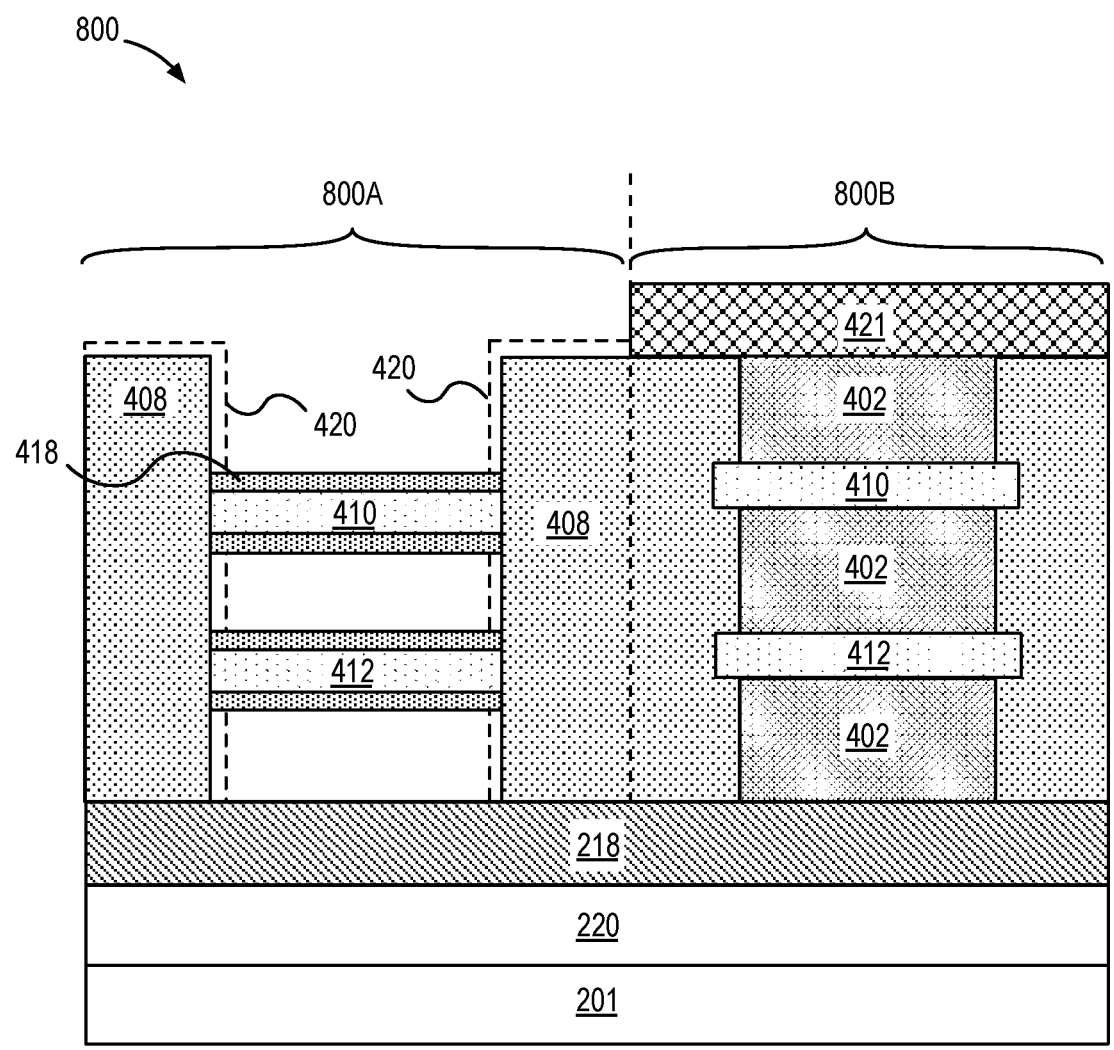
FIG. 8 is a cross-sectional illustration of a pair of partially fabricated devices structures that are laterally spaced apart by a dielectric.

FIG. 8 is a structure 800 that includes a device structure 800A adjacent to a device structure 800B. Device structures 800A and 800B will formed into transistors. The device structure 800A is substantially the same as the device structure in FIG. 5A, except where the mask 412 is replaced by a mask 421 in FIG. 8. As shown, mask 421 extends over the entire device structure 800B.

In one or more embodiments, the device structure 800 is formed as described above. After formation of the encapsulation layer 418 on TMD channel layers 410 and 412, the fabrication process may be continued on device structure 800A while the device structure 800A is masked.

Figure 9A:
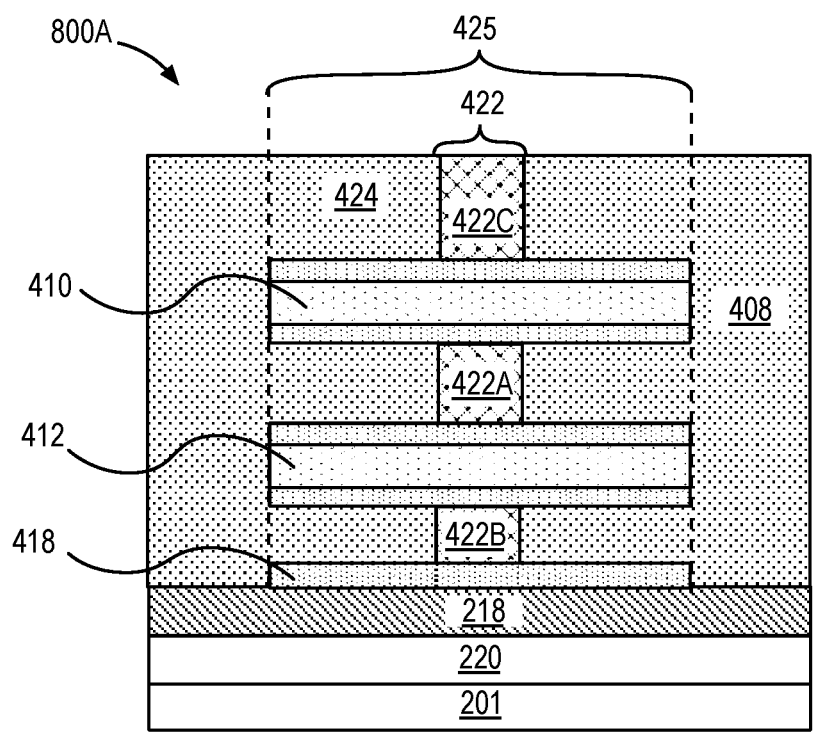
FIG. 9A is a cross-sectional illustration of the structure in FIG. 7A following the formation of a dummy gate structure in the opening and following the deposition of a dielectric adjacent to the dummy gate structure.

FIG. 9A is a cross-sectional illustration of the structure 800A in FIG. 8A following the formation of a dummy gate structure 422 in the opening and following the deposition of dielectric 424 after formation of the dummy gate structure 422.

The material of the dummy gate structure is chosen to facilitate patterning as well as selective removal with respect to the dielectric 424 and encapsulation layer 418. In an embodiment, a polycrystalline silicon material is deposited into the opening 425. A polycrystalline silicon material advantageously offers ease of patterning and selective removal with respect to the encapsulation layer 418. After deposition the polycrystalline silicon material is planarized and patterned into a dummy gate structure 422. The dummy gate structure also includes portions 422A and 422B between the TMD channel layers 410 and 412 and between TMD layers 412 and template layer 418, respectively and a portion 422C above the TMD channel layer 410. Portions 422A, 422B and 422C will be replaced by a gate structure including a gate dielectric layer and a gate electrode in a subsequent operation.

After the formation of the dummy gate structure 422 a dielectric 424 is blanket deposited into the opening 425 and planarized. In some embodiments, the dielectric 424 includes silicon and one or more of nitrogen, oxygen or carbon. The material of the dielectric 424 may affect the capacitance in a TMD nanosheet transistor to be formed. In one embodiment, the dielectric 424 is a silicon nitride. In other embodiments, the dielectric 424 includes a material having a low dielectric constant, such as a dielectric constant equal to or below 2. In embodiments, dielectric 424 is silicon oxide or silicon carbide.

Figure 9B:
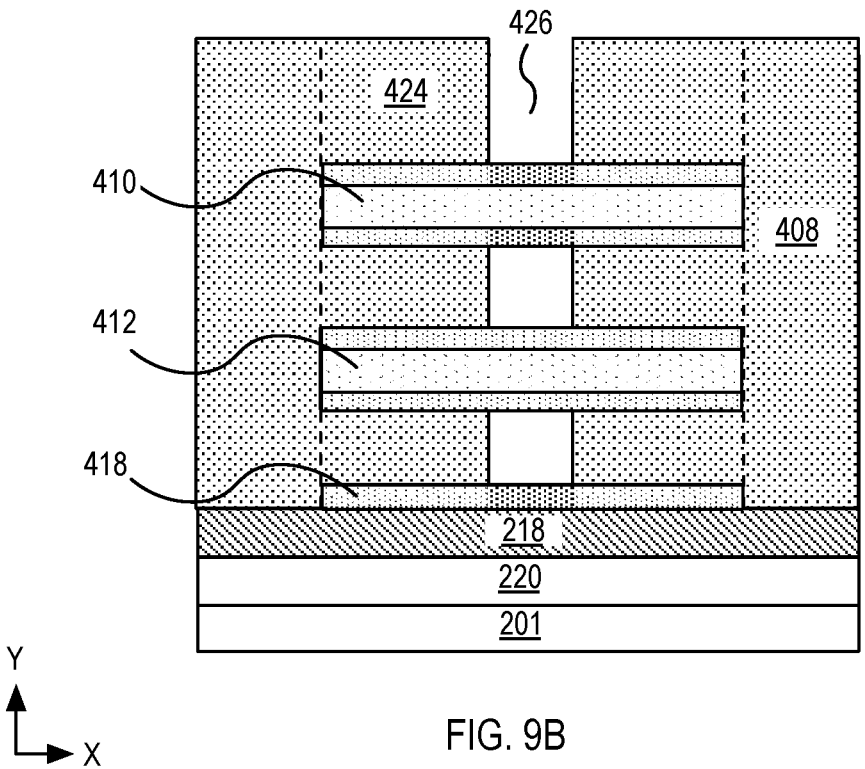
FIG. 9B illustrates the structure of FIG. 9A following the removal of the dummy gate structure.

FIG. 9B illustrates the structure of FIG. 9A following the removal of the dummy gate structure 422 (not shown in Figure). In an embodiment, a plasma etch process may be performed to remove a first portion of the dummy gate structure 422, followed by a wet chemical process to remove a remaining second portion. The dummy gate structure 422 is removed from between the TMD channel layers 410 and 412, from between TMD layers 412 and template layer 418, and from above the TMD channel layer 410. The process of removing the dummy gate structure 422 does not etch the encapsulation layer 418.

Figure 10A:
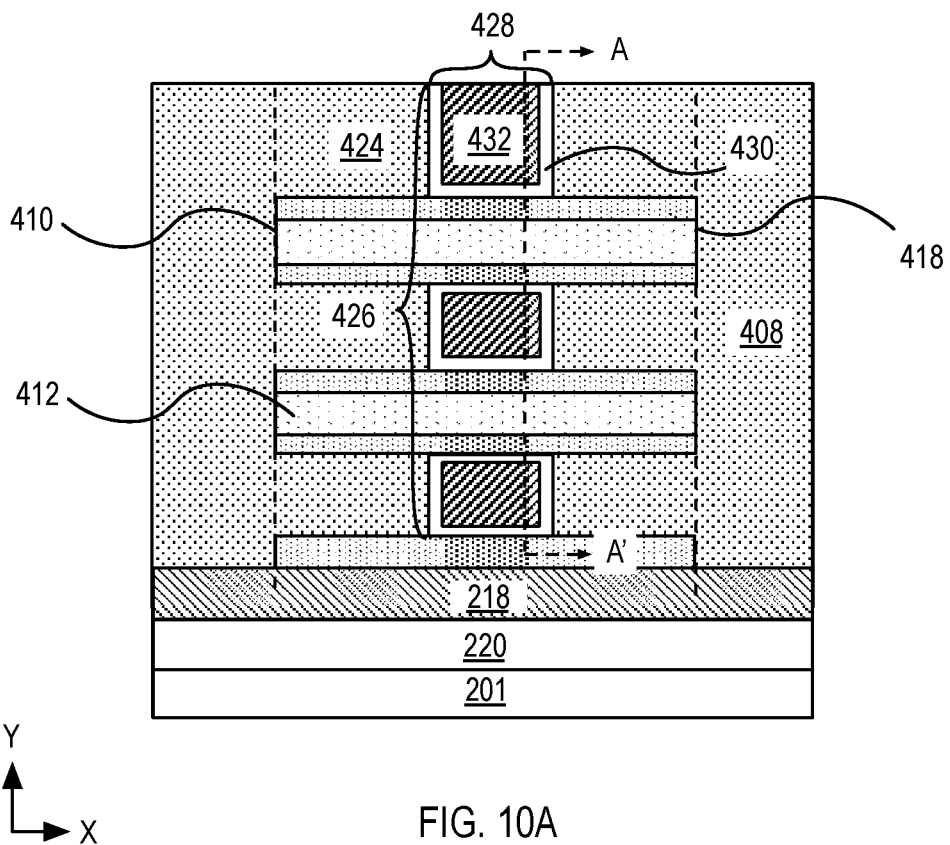
FIG. 10A illustrates the structure of FIG. 10B following the formation of a gate structure in the opening.

FIG. 10A illustrates the structure of FIG. 9B following the formation of a gate structure 428 in the opening 426 formed after removal of the dummy gate structure. In an embodiment, the process begins by forming a gate dielectric layer 430 in the opening 426 on all exposed surfaces of the encapsulation layer 418. In an embodiment, the gate dielectric layer 430 is deposited by an atomic layer deposition (ALD) process. The ALD process forms a conformal layer of gate dielectric layer 430 on surfaces of the encapsulation layer 418, and on the template layer 218, on uppermost surfaces of dielectrics 408 and 424. In an embodiment, the gate dielectric layer 430 is deposited to a thickness between 0.8 nm and 4 nm. A material of a gate electrode 432 is deposited on the gate dielectric layer 430 in the opening 426 and above the dielectrics 408 and 424. In an embodiment, an ALD process is utilized to deposit the gate electrode material between the TMD layers 410 and TMD channel layer 412, between TMD channel layer 412 and template layer 418 and above TMD channel layer 410.

In an embodiment, after the deposition process the gate electrode material and the gate dielectric layer 430, from above the dielectric 408 and dielectric 424, are removed by a CMP process to form gate structure 428.

Figure 10B:
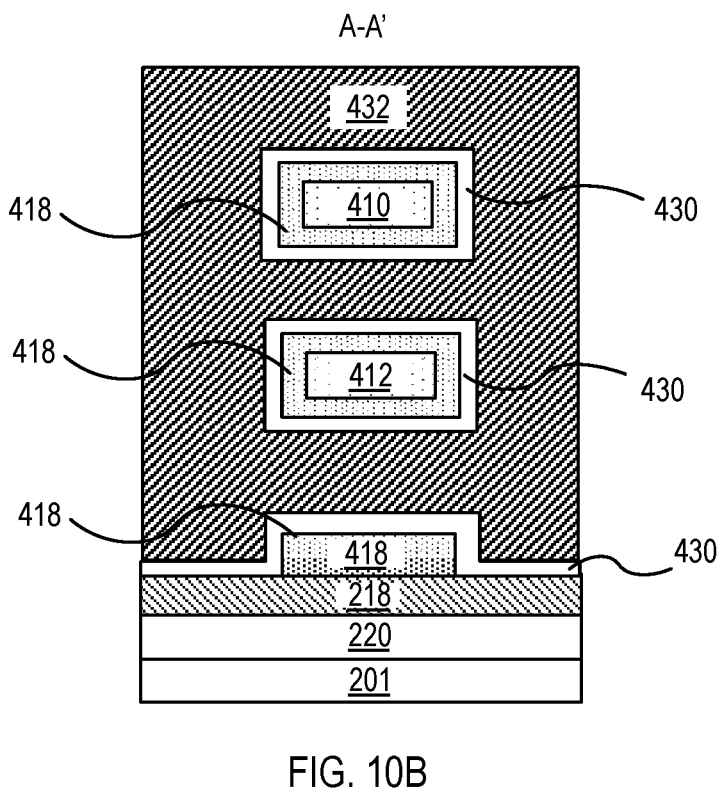
FIG. 10B is a cross sectional illustration through a line A-A' in FIG. 10A.

FIG. 10B is a cross sectional illustration through a line A-A' in FIG. 10A. In an embodiment, the gate electrode 432 is a single connected continuous portion, extending between each respective TMD channel layers 410 and 412, as shown. In the illustrative embodiment, the gate dielectric layer 430 clads the encapsulation layer 418 formed around each of the TMD channel layers 410 and 412.

FIG. 11A is a cross-sectional illustration of the structure in FIG. 10A following the formation of openings 433A and 433B to deposit source and drain contact material. In an embodiment, a plasma etch process is utilized to form openings 433A and 433B after the formation of a mask on dielectric 408 and 424, on the gate dielectric layer 430 and on the gate electrode 432. In an embodiment, the dielectric 408 and the dielectric 424 are etched by a plasma etch process to form openings 433A and 433B.

In an embodiment, opening 433A exposes the encapsulation layer 418 adjacent to a first portion TMD channel layers 410 and 412 and an opening 433B exposes the encapsulation layer 418 adjacent to second portion of the TMD channel layers 410 and 412, as shown. In an embodiment, the openings 433A and 433B can extend to gate dielectric layer 430. In the illustrative embodiment, a portion of dielectric 424 is adjacent to gate dielectric layer 430 to provide electrical isolation when the gate dielectric layer has a thickness that is comparable to 1 nm. In the illustrative embodiment, the plasma etch process utilized to form openings 433A and 433B has sufficient isotropic etch components to advantageously remove the dielectric layer 424 from regions between TMD channel layers 410 and 412, and between TMD layers 412 and template layer 218. Removal of the dielectric 408 and 422 between TMD channel layers 410 and 412, and between TMD layers 412 and template layer 218 enables contacts to be formed adjacent to encapsulation layer 418. In exemplary embodiments, template layer 218 does not need to be exposed as long as dielectric 424 adjacent the encapsulation layer portion 418A is removed.

In an embodiment, the etch process can remove portions of the encapsulation layer 418 from above the TMD channel layer 410 as shown in FIG. 11B. Referring again to FIG. 11A, in some embodiments, the etch process is also sufficiently isotropic that portions of the encapsulation layer 418 between the TMD channel layer 410 and 412 within the openings 433A and 433B are also removed during formation of opening 433A and 433B. It is to be appreciated that the portion of the encapsulation layer 418 masked by the dielectric 424 is not removed even if exposed portions of the encapsulation layer 418 may be etched. Encapsulation layer 418 adjacent to gate dielectric layer 430 but directly under (or above) dielectric 424 may advantageously provide charge transfer between source contact and channel portions of the TMD channel layers 410 and 412 (region under and between portions of gate electrode 432). Encapsulation layer 418 adjacent to gate dielectric layer 430 but directly under dielectric 424 may help reduce access resistance between gate and drain or between gate and source.

It is to be appreciated that the etch process is selective to the gate dielectric layer 430. In embodiments, a gate dielectric layer 430 including a high-dielectric constant material such as $HfO_2$ or $ZrO_2$ etc, can provide sufficient etch selectivity against removal of the encapsulation layer 418.

FIG. 12 illustrates the structure of FIG. 11A following the formation of source contact 434 and drain contact 436 in the openings 433A and 433B, respectively. In an embodiment, one or more layers of contact material are blanket deposited on exposed surfaces of the encapsulation layer 418 and on uppermost surface of the dielectrics 408 and 424, gate dielectric layer 430, gate electrode 432, and template layer 218. In an embodiment, the contact material includes one or more layers of conductive materials that are substantially the same as the material of the source contact 110 and drain contact 112 (described in association with Figure. In an embodiment, the one or more layers of conductive material are deposited in the openings 433A and 433B. In an embodiment, a planarization process is utilized to remove the excess one or more layers of conductive material formed on uppermost surface of the dielectric 424, dielectric 408, gate dielectric layer 430 and gate electrode 432. The planarization process forms source contact 434 and drain contact 436 of transistor 1200.

Figure 13:
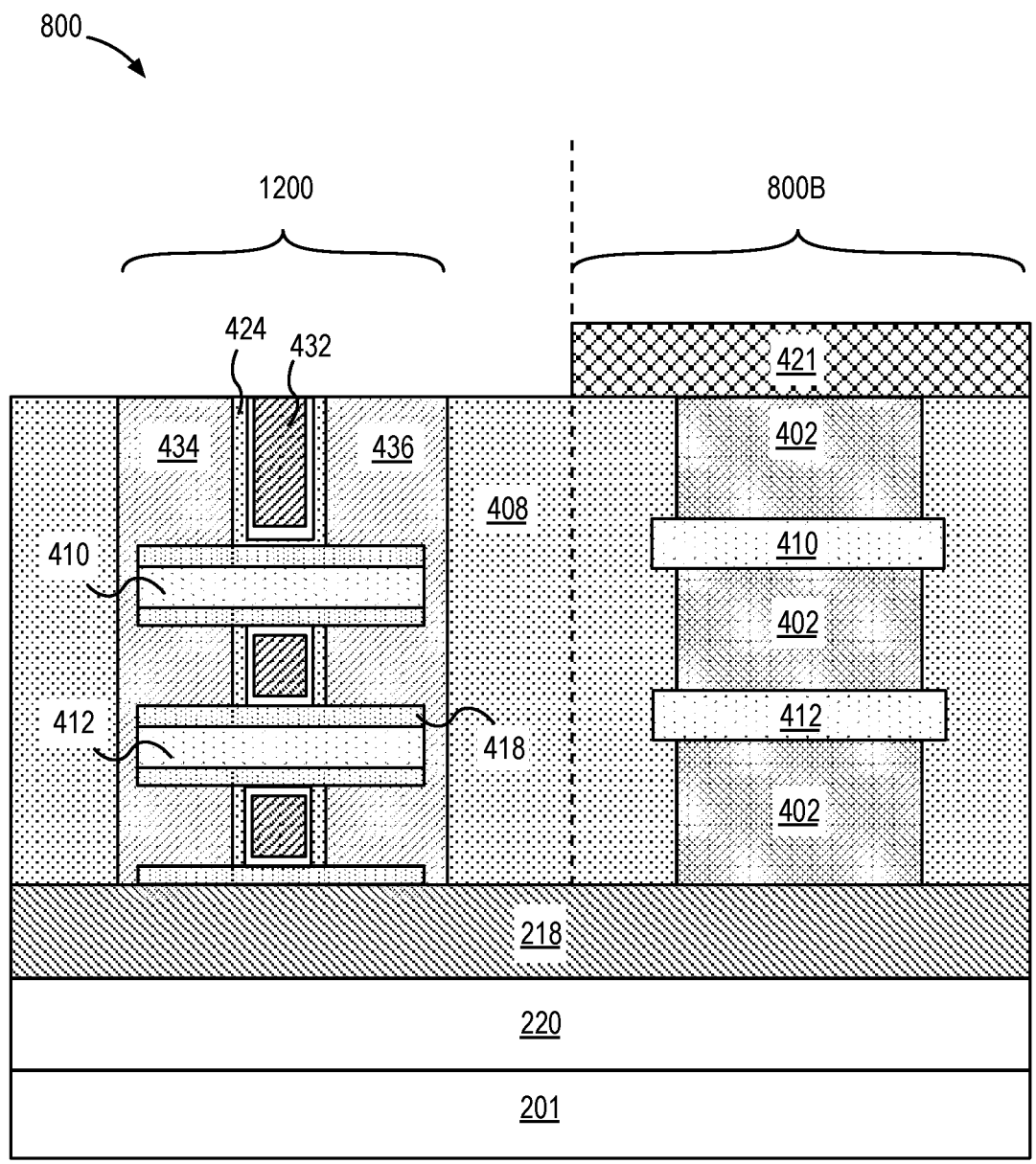
FIG. 13 is a cross-sectional illustration of a transistor adjacent to a partially fabricated transistor structure laterally separated by a dielectric.

FIG. 13 is a structure 800, including a transistor 1200 adjacent to the device structure 800B (from FIG. 8). In an embodiment, a mask can be formed above transistor 1200 and the device structure 800 can evolve through a sequence of operations similar to operations outlined herein to fabricate a second transistor directly adjacent to transistor 1200. The second transistor may or may not be fabricated with an encapsulation layer.

FIG. 14A illustrates a cross-sectional view of a memory cell 1400 including a nanosheet transistor with a plurality of TMD channels, such as transistor 1200 and a non-volatile memory element 1402 coupled to a drain contact 436 of the transistor 1200. In the illustrative embodiment, the non-volatile memory element 1402 is coupled to the drain contact 436 of the transistor 1200.

Non-volatile memory element 1402 may include a magnetic tunnel junction (MTJ) device, a conductive bridge random access memory (CBRAM) device, or a resistive random-access memory (RRAM) device. A non-volatile memory element such as an MTJ device requires a nominal critical switching current, that depends on an MTJ device area, to undergo magnetization switching. As an MTJ is scaled down in size, the critical switching current required to switch the memory state of the MTJ device also scales proportionally with device area, however scaling MTJ's presents numerous challenges. If a transistor connected to an MTJ device can deliver an amount of current that exceeds critical switching current requirement of the MTJ device, then feature size scaling of MTJ devices can be relaxed. In an embodiment, transistor 1200, which can provide an additional current boost (through increase in drive current), can be advantageously coupled to non-volatile memory element 1402 such as an MTJ device to overcome any larger critical switching current requirements.

FIG. 14B illustrates a cross-sectional view of an example non-volatile memory element 1402 that includes a magnetic tunnel junction (MTJ) material device. In the illustrated embodiment, the MTJ device includes a bottom electrode 1404, a fixed magnet 1406 above the bottom electrode 1404, a tunnel barrier 1408 on the fixed magnet 1406, a free magnet 1410 on the tunnel barrier 1408, and a top electrode 1412 on the free magnet 1410. In an embodiment, a dielectric spacer laterally surrounds (not shown) non-volatile memory element 1402.

In an embodiment, fixed magnet 1406 includes a material and has a thickness sufficient for maintaining a fixed magnetization. For example, fixed magnet 1406 may include an alloy such as CoFe and CoFeB. In an embodiment, fixed magnet 1406 includes $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, fixed magnet 1406 is FeB, where the concentration of boron is between 10 and 40 atomic percent of the total composition of the FeB alloy. In an embodiment, the fixed magnet 1406 has a thickness that is between 1 nm and 2.5 nm.

In an embodiment, tunnel barrier 1408 is composed of a material suitable for allowing electron current having a majority spin to pass through tunnel barrier 1408, while impeding, at least to some extent, electron current having a minority spin from passing through tunnel barrier 1408. Thus, tunnel barrier 1408 (or spin filter layer) may also be referred to as a tunneling layer for electron current of a particular spin orientation. In an embodiment, tunnel barrier 1408 includes a material such as, but not limited to, magnesium oxide (MgO) or aluminum oxide ($Al_2O_{14}$). In an embodiment, tunnel barrier 1408 including MgO has a crystal orientation that is (001) and is lattice matched to free magnet 1410 above tunnel barrier 1408 and fixed magnet 1406 below tunnel barrier 1408. In an embodiment, tunnel barrier 1408 is MgO and has a thickness is between 1 nm to 2 nm.

In an embodiment, free magnet 1410 includes a magnetic material such as Co, Ni, Fe or alloys of these materials. In an embodiment, free magnet 1410 includes a magnetic material such as FeB, CoFe and CoFeB. In an embodiment, free magnet 1410 includes a $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, free magnet 1410 is FeB, where the concentration of boron is between 10 and 40 atomic percent of the total composition of the FeB alloy. In an embodiment, free magnet 1410 has a thickness that is between 1 nm and 2.0 nm.

In an embodiment, bottom electrode 1404 includes an amorphous conductive material. In an embodiment, bottom electrode 1404 is a topographically smooth electrode. In an embodiment, bottom electrode 1404 includes a material such as W, Ta, TaN or TiN. In an embodiment, bottom electrode 1404 is composed of Ru layers interleaved with Ta layers. In an embodiment, bottom electrode 1404 has a thickness between 20 nm and 50 nm. In an embodiment, top electrode 1412 includes a material such as W, Ta, TaN or TiN. In an embodiment, top electrode 1412 has a thickness between 30 nm and 70 nm. In an embodiment, bottom electrode 1404 and top electrode 1412 are the same metal such as Ta or TiN. In an embodiment, the MTJ device has a combined total thickness of the individual layers is between 60 nm and 100 nm and a width is between 10 nm and 50 nm.

Referring again to FIG. 14A, in an embodiment, non-volatile memory element 1402 is a resistive random-access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 1200, that can provide an additional current boost (through increase in drive current), can be advantageously coupled to an RRAM device to provide reliable switching operation.

FIG. 14C illustrates a cross-sectional view of an example non-volatile memory element 1402 that includes a resistive random-access memory (RRAM) device. In the illustrated embodiment, the RRAM material stack includes a bottom electrode 1414, a switching layer 1416 over the bottom electrode 1414, an oxygen exchange layer 1418 over the switching layer 1416, and a top electrode 1420 on the oxygen exchange layer 1418.

In an embodiment, bottom electrode 1414 includes an amorphous conductive layer. In an embodiment, bottom electrode 1414 is a topographically smooth electrode. In an embodiment, bottom electrode 1414 includes a material such as W, Ta, TaN or TiN. In an embodiment, bottom electrode 1414 is composed of Ru layers interleaved with Ta layers. In an embodiment, bottom electrode 1414 has a thickness is between 20 nm and 50 nm. In an embodiment, top electrode 1420 includes a material such as W, Ta, TaN or TiN. In an embodiment, top electrode 1420 has a thickness is between 140 and 70 nm. In an embodiment, bottom electrode 1414 and top electrode 1420 are the same metal such as Ta or TiN.

Switching layer 1416 may be a metal oxide, for example, including oxygen and atoms of one or more metals, such as, but not limited to Hf, Zr, Ti, Ta or W. In the case of titanium or hafnium, or tantalum with an oxidation state +4, switching layer 1416 has a chemical composition, $MO_X$, where O is oxygen and X is or is substantially close to 2. In the case of tantalum with an oxidation state +5, switching layer 1416 has a chemical composition, $M_2O_x$, where O is oxygen and X is or is substantially close to 5. In an embodiment, switching layer 1416 has a thickness is between 1 nm and 5 nm.

Oxygen exchange layer 1418 acts as a source of oxygen vacancy or as a sink for $O^{2-}$. In an embodiment, oxygen exchange layer 1418 is composed of a metal such as but not limited to, hafnium, tantalum or titanium. In an embodiment, oxygen exchange layer 1418 has a thickness is between 5 nm and 20 nm. In an embodiment, the thickness of oxygen exchange layer 1418 is at least twice the thickness of switching layer 1416. In another embodiment, the thickness of oxygen exchange layer 1418 is at least twice the thickness of switching layer 1416. In an embodiment, the RRAM device has a combined total thickness of the individual layers is between 60 nm and 100 nm and width is between 10 nm and 50 nm.

Referring again to FIG. 14A, the memory device 1402 is coupled to the transistor 1200 through interconnect structures at a level 1422 above the transistor. In an embodiment, level 1422 includes a single level of interconnects coupled with the transistor 1200. In other embodiments, level 1422 includes a plurality of sublevels of interconnect routing structures.

In the illustrative embodiment, the memory cell 1400 includes a drain interconnect 1424 between the memory device 1402 and the drain contact 436. As shown, the drain interconnect 1424 is on and coupled with the drain contact 436. The memory cell 1400 further includes a source interconnect 1426 coupled with the source contact 434 and gate interconnect 1428 coupled with the gate 432. In other embodiments, a gate contact is between the gate 432 and the gate interconnect 1428. The memory device 1402 is further coupled to a memory interconnect 1430.

In an embodiment, source interconnect 1426, gate interconnect 1428 and drain interconnect 1424 are embedded in a dielectric layer 1432. In an embodiment, the source interconnect 1426, gate interconnect 1428, drain interconnect 1424 and memory interconnect 1430 each include titanium, tantalum, tungsten, ruthenium, copper, or nitrides of titanium, tantalum, tungsten, ruthenium. In other embodiments the source interconnect 1426, gate interconnect 1428, drain interconnect 1424 and memory interconnect 1430, include a liner layer including ruthenium or tantalum and a fill metal such as copper or tungsten. In the illustrative embodiment, the memory device 1402 and the memory interconnect 1430 is embedded in a dielectric 1434.

In an embodiment, the level 1422 further includes a barrier dielectric layer 1436 between the dielectric 1432 and dielectric 1434. In embodiments dielectric 1432 and 1434 include silicon and one or more of nitrogen, oxygen and carbon such as, silicon nitride, silicon dioxide, carbon doped silicon nitride, silicon oxynitride or silicon carbide.

In embodiments, dielectric 1436 includes silicon and one or more of nitrogen and carbon such as, silicon nitride, carbon doped silicon nitride or silicon carbide.

Figure 15:
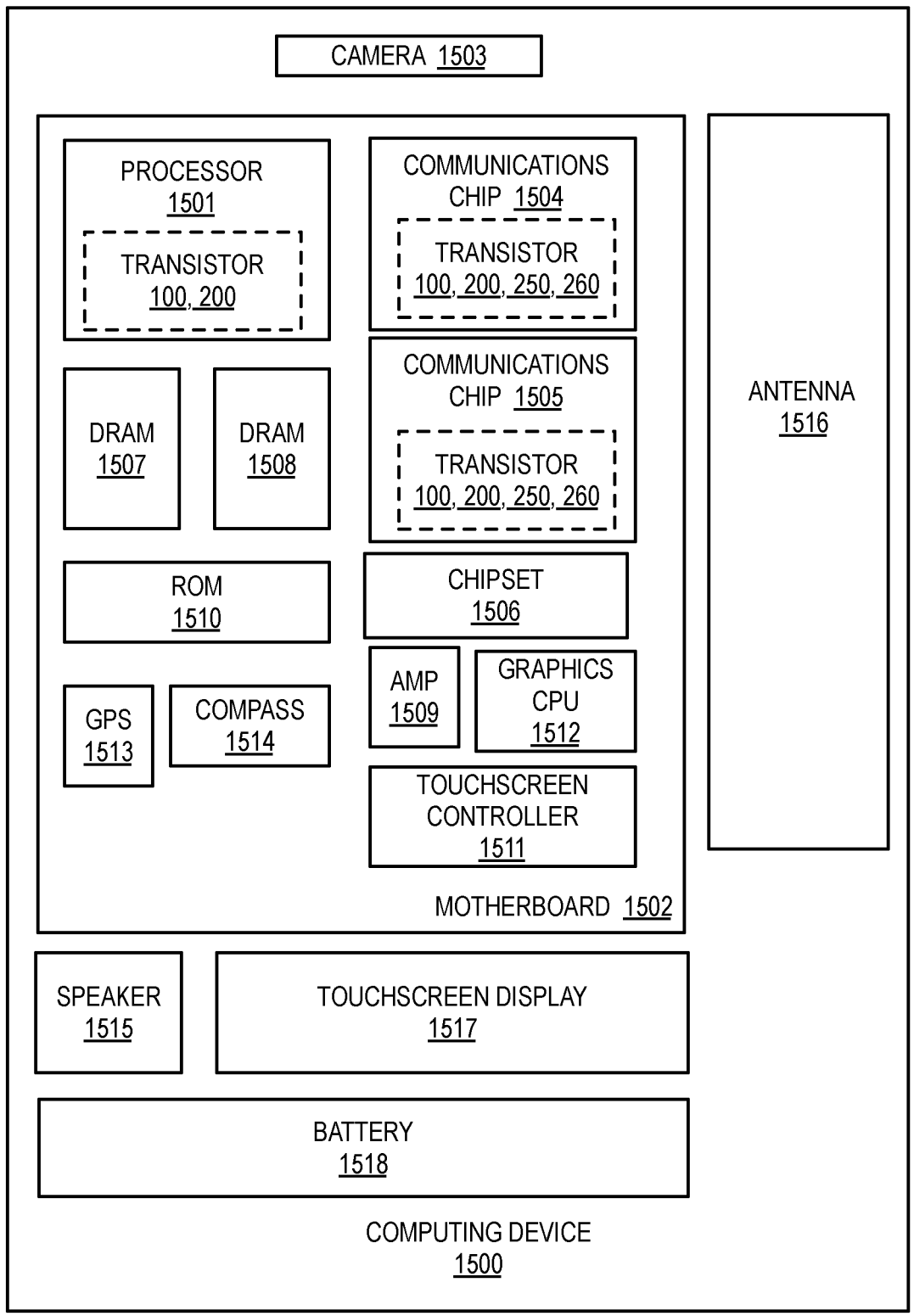
FIG. 15 illustrates a computing device in accordance with embodiments of the present disclosure.

FIG. 15 illustrates a computing device 1500 in accordance with embodiments of the present disclosure. As shown, computing device 1500 houses a motherboard 1502. Motherboard 1502 may include a number of components, including but not limited to a processor 1501 and at least one communications chip 1504 or 1505. Processor 1501 is physically and electrically coupled to the motherboard 1502. In some implementations, communications chip 1505 is also physically and electrically coupled to motherboard 1502. In further implementations, communications chip 1505 is part of processor 1501.

Depending on its applications, computing device 1500 may include other components that may or may not be physically and electrically coupled to motherboard 1502. These other components include, but are not limited to, volatile memory (e.g., DRAM), non-volatile memory (e.g., ROM), flash memory, a graphics processor, a digital signal processor, a crypto processor, a chipset 1506, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1505 enables wireless communications for the transfer of data to and from computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1505 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1500 may include a plurality of communications chips 1504 and 1505. For instance, a first communications chip 1505 may be dedicated to shorter range wireless communications such as Wi-Fi and Bluetooth and a second communications chip 1504 may be dedicated to longer range wireless communications such as GPS, EDGE, GPRS, CDMA, WiMAX, LTE, Ev-DO, and others.

Processor 1501 of the computing device 1500 includes an integrated circuit die packaged within processor 1501. In some embodiments, the integrated circuit die of processor 1501 includes one or more interconnect structures, non-volatile memory devices, and transistors such as TMD nanosheet transistors 100, 200, or transistor arrays 250 or 260 respectively. The term "processor" may refer to any device or portion of a device that processes electronic data from registers and/or memory to transform that electronic data into other electronic data that may be stored in registers and/or memory.

Communications chip 1505 also includes an integrated circuit die packaged within communication chip 1505. In another embodiment, the integrated circuit die of communications chips 1504, 1505 includes one or more interconnect structures, non-volatile memory devices, capacitors and transistors such as TMD nanosheet transistors 100, 200, or transistor arrays 250 or 260, described above. Depending on its applications, computing device 1500 may include other components that may or may not be physically and electrically coupled to motherboard 1502. These other components may include, but are not limited to, volatile memory (e.g., DRAM) 1507, 1508, non-volatile memory (e.g., ROM) 1510, a graphics CPU 1512, flash memory, global positioning system (GPS) device 1513, compass 1514, a chipset 1506, an antenna 1516, a power amplifier 1509, a touchscreen controller 1511, a touchscreen display 1517, a speaker 1515, a camera 1503, and a battery 1518, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1500 and discussed above may contain a stand-alone integrated circuit memory die that includes one or more arrays of NVM devices.

In various implementations, the computing device 1500 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1500 may be any other electronic device that processes data.

Figure 16:
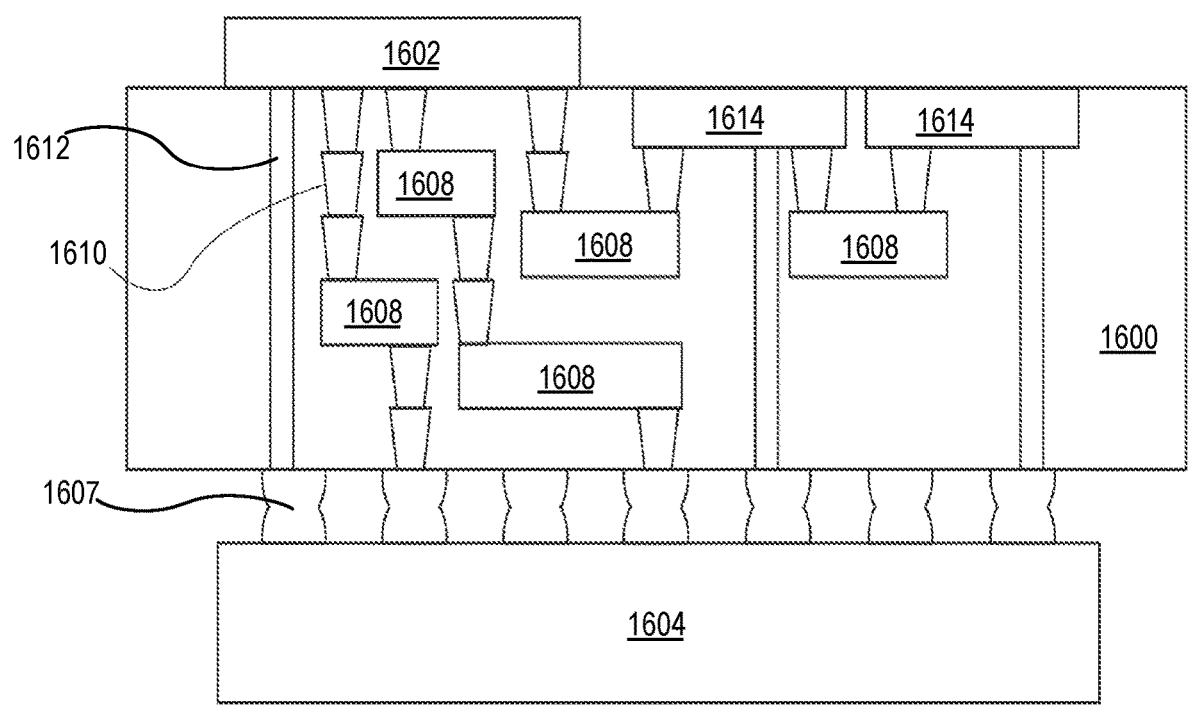
FIG. 16 illustrates an integrated circuit (IC) structure that includes one or more embodiments of the present disclosure.

FIG. 16 illustrates an integrated circuit (IC) structure 1600 that includes one or more embodiments of the disclosure. The integrated circuit (IC) structure 1600 is an intervening substrate used to bridge a first substrate 1602 to a second substrate 1604. The first substrate 1602 may be, for instance, an integrated circuit die. The second substrate 1604 may be, for instance, a memory module, a computer mother, or another integrated circuit die. Generally, the purpose of an integrated circuit (IC) structure 1600 is to spread a connection to a wider pitch or to reroute a connection to a different connection. For example, an integrated circuit (IC) structure 1600 may couple an integrated circuit die to a ball grid array (BGA) 1607 that can subsequently be coupled to the second substrate 1604. In some embodiments, the first substrate 1602 and the second substrate 1604 are attached to opposing sides of the integrated circuit (IC) structure 1600. In other embodiments, the first substrate 1602 and the second substrate 1604 are attached to the same side of the integrated circuit (IC) structure 1600. And in further embodiments, three or more substrates are interconnected by way of the integrated circuit (IC) structure 1600.

The integrated circuit (IC) structure 1600 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1608 and vias 1610, including but not limited to through-silicon vias (TSVs) 1612. The integrated circuit (IC) structure 1600 may further include embedded devices 1614, including both passive and active devices. Such embedded devices 1614 include capacitors, decoupling capacitors, resistors, inductors, fuses, diodes, transformers, device structure including transistors, such as TMD nanosheet transistors 100, 200, or transistor arrays 250 or 260 described in association with FIGS. 1A, 2A, 2C and 2D. Referring again to FIG. 16 the integrated circuit (IC) structure 1600 may further include embedded devices 1614 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 1600.

Thus, one or more embodiments of the present disclosure relate to encapsulation layer for TMD nanosheet transistors 100, 200, or transistor arrays 250 or 260, as described above.

In a first example, a transistor includes a channel layer including a transition metal dichalcogenide (TMD) material, an encapsulation layer on a first portion of the channel layer, a gate electrode above the encapsulation layer, a gate dielectric layer between the gate electrode and the encapsulation layer, a source contact on a second portion of the channel layer and a drain contact on a third portion of the channel layer, where the gate structure is between the drain contact and the source contact.

In second examples, for any of first example, the TMD material includes at least one of molybdenum, tungsten, titanium or chromium, and at least one of sulfur, selenium or tellurium.

In third examples, for any of the first through second examples, the channel layer has a thickness between 1 and 4 monolayers.

In fourth examples, for any of the first through third examples, the encapsulation layer includes oxygen and at least one of aluminum, molybdenum or tungsten, or a sub-stoichiometric aluminum oxide, tungsten oxide, or molybdenum oxide.

In fifth examples, for any of the first through fourth examples, the encapsulation layer includes a first metal and the TMD material includes a second metal, the second metal different from the first metal.

In sixth examples, for any of the first through fifth examples, the encapsulation layer includes a material that is different from a material of the gate dielectric layer.

In seventh examples, for any of the first through sixth examples, the channel layer is a first channel layer, where the drain contact is a first drain contact, where the source contact is a first source contact, where in the gate electrode is a first gate electrode, where the gate dielectric layer is a first gate dielectric layer and where the transistor is a first transistor in an array of transistors, where the array of transistors further includes a second transistor. The second transistor includes a second channel layer including the TMD material, a second gate electrode above a fourth portion of the second channel layer, a second gate dielectric layer between the second gate electrode and the second channel layer, a second source contact on a fifth portion of the second channel layer and a second drain contact on a sixth portion of the second channel layer, where the second gate electrode is between second drain contact and the second source contact.

In eighth examples, for any of the first through seventh examples, the encapsulation layer is a first encapsulation layer, and the second transistor further includes a second encapsulation layer, where the first encapsulation layer includes a first material, and the second encapsulation layer includes a second material.

In ninth examples, for any of the first through eighth examples, the first encapsulation layer includes one of oxygen and aluminum, or sub-stoichiometric aluminum oxide, and the second encapsulation layer includes oxygen and molybdenum or tungsten, or sub-stoichiometric tungsten oxide or molybdenum oxide.

In tenth examples, for any of the first through ninth examples, the first gate dielectric and the second gate dielectric layer include a same or a different material and the first and the second gate electrode include a same or a different material.

In eleventh examples, transistor includes a first channel layer over a second channel layer, where the first and the second channel layers each include a monocrystalline transition metal dichalcogenide (TMD) material, the TMD material including a first metal, an encapsulation layer including a second metal, where the encapsulation layer is adjacent the first channel layer and the second channel layer. The transistor further includes a source structure coupled to a first end of the first and second channel layers, a drain structure coupled to a second end of the first and second channel layers, a gate electrode between the source material and the drain material, and between the first channel layer and the second channel layer and a gate dielectric between the gate electrode and the encapsulation layer.

In twelfth examples, for any of the eleventh examples, the first metal comprises molybdenum, tungsten or chromium, wherein the TMD material further includes at least one of sulfur, selenium or tellurium and wherein the first and second channel layers each have a thickness between 1 and 4 monolayers.

In thirteenth examples, for any of the eleventh through twelfth examples, the second metal includes aluminum, tungsten, molybdenum, and encapsulation layer includes a thickness between 0.5 nm and 3 nm.

In a fourteenth example, for any of the eleventh through thirteenth examples, the first metal is different from the second metal.

In fifteenth examples, for any of the eleventh through fourteenth examples, each of the first and second channel layers have a first thickness along a first direction orthogonal to a length of the first and of the second channel layers, where each of the first and second channel layers have a second thickness along a second direction orthogonal to the first direction and to the length, where the first thickness is between 5 nm and 60 nm, and where the second thickness is between 1 and 4 monolayers, and where the encapsulation layer clads each of the first and the second channel layers in the first and in the second directions.

In sixteenth examples, a method of fabricating a transistor includes patterning a material layer stack including a layer of a III-N material on a plurality of bilayers, where each bilayer is formed by depositing a channel layer including a monocrystalline transition metal dichalcogenide (TMD) on a layer of the III-N material. The method further includes forming a dielectric adjacent the dummy gate and adjacent to the block and etching and removing a portion of the dielectric to form an exposed portion of the block. The method further includes etching and removing the layer of III-N material in each bilayer to suspend a plurality of channel layers in the exposed portion of the block and forming a liner to clad the plurality of channel layers in the exposed portion of the block. The method further includes forming a gate between each of plurality of channel layers in a first portion of the exposed portion of the block and forming a first contact in a second portion of the block and a second contact in a third portion of the block, where the first portion is between the second portion and the third portion.

In seventeenth examples, for any of the sixteenth example, forming the gate structure includes forming a dummy gate after formation of the liner, forming a dielectric layer adjacent to the dummy gate and removing the dummy gate to deposit a material of the gate structure.

In eighteenth examples, for any of the sixteenth through seventeenth examples, forming the gate structure includes conformally depositing a gate oxide on the liner and depositing a gate electrode material adjacent to the gate dielectric layer.

In nineteenth examples, for any of the sixteenth through eighteenth examples, etching and removing the layer of III-N material adjacent to the channel layer to form a plurality of channel layers in the exposed portion of the block includes anchoring opposite ends of the block to the dielectric.

In twentieth example, for any of the sixteenth through nineteenth examples, forming the source and drain contact includes etching a portion of the liner from an upper surface of an uppermost channel layer in the plurality of channel layers.

What is claimed is:

1. An apparatus, comprising:
   a first transistor of a first conductivity type, the first transistor comprising:
      a first channel region comprising a transition metal and a chalcogen;
      a first gate electrode coupled to the first channel region;
      an encapsulation material in direct contact with the first channel region, wherein the encapsulation material comprises oxygen and a second metal, different than the transition metal;
      a first gate insulator between the first gate electrode and the encapsulation material, wherein the first gate insulator is in direct contact with the encapsulation material; and
      a first source contact and a first drain contact coupled to the first channel region, wherein the first gate electrode and the encapsulation material are between the first drain contact and the first source contact;
   a second transistor of a complementary second conductivity type and laterally adjacent to the first transistor, the second transistor comprising:
      a second channel region comprising the transition metal and the chalcogen, but not in direct contact with the encapsulation material;
      a second gate electrode coupled to the second channel region;
      a second gate insulator between the second gate electrode and the second channel region; and
      a second source contact and a second drain contact coupled to the second channel region, wherein the second gate electrode is between the second drain contact and the second source contact.

2. The apparatus of claim 1, wherein the first conductivity type is n-type and the second conductivity type is p-type.

3. The apparatus of claim 1, wherein:
   the first channel region is over a third channel region, wherein the first and the third channel regions each comprise the transition metal and the chalcogen; and
   the encapsulation layer is in direct contact with the first channel region and in direct contact with the third channel region.

4. The apparatus of claim 3, wherein the transition metal comprises molybdenum, tungsten or chromium, wherein the chalcogen comprises sulfur, selenium or tellurium and wherein the first and third channel regions each have a thickness between 1 and 4 monolayers.

5. The apparatus of claim 3, wherein the second metal comprises aluminum, tungsten, or molybdenum, and the encapsulation layer has a thickness between 0.5 nm and 3 nm.

6. The apparatus of claim 3, wherein each of the first and third channel regions has a first thickness along a first direction orthogonal to a length of the first and second channel regions, wherein each of the first and second channel regions have a second thickness along a second direction orthogonal to the first direction and orthogonal to the length, wherein the first thickness is between 5 nm and 60 nm, and wherein the second thickness is between 1 and 4 monolayers, and wherein the encapsulation layer clads each of the first and the second channel regions in the first and in the second directions.

7. The apparatus of claim 1, wherein:
   the second metal is aluminum;
   the second transistor comprises a second encapsulation material in direct contact with the second channel region and in direct contact with the second gate insulator; and
   the second encapsulation material comprises oxygen and molybdenum or tungsten.

8. The apparatus of claim 1, wherein
   the gate insulator comprises a third metal, different from the second metal.

9. The apparatus of claim 1, wherein the transition metal comprises at least one of molybdenum, tungsten, titanium or chromium, and the chalcogen comprises sulfur, selenium or tellurium.

10. The apparatus of claim 1, wherein the first channel region has a thickness between 1 and 4 monolayers.

11. The apparatus of claim 1, wherein the encapsulation layer comprises a sub-stoichiometric aluminum oxide, tungsten oxide, or molybdenum oxide.

12. The apparatus of claim 1, wherein the first gate insulator and the second gate insulator comprise a same material.

13. The apparatus of claim 1, wherein the second gate insulator is in direct contact with the second channel region.

* * * * *